US011908660B2

(12) United States Patent
Bhowmick et al.

(10) Patent No.: US 11,908,660 B2
(45) Date of Patent: *Feb. 20, 2024

(54) SYSTEMS AND METHODS FOR OPTIMIZING POWER DELIVERY TO AN ELECTRODE OF A PLASMA CHAMBER

(71) Applicant: Lam Research Corporation, Fremont, CA (US)

(72) Inventors: Ranadeep Bhowmick, San Jose, CA (US); John Holland, San Jose, CA (US); Felix Leib Kozakevich, Sunnyvale, CA (US); Bing Ji, Pleasanton, CA (US); Alexei Marakhtanov, Albany, CA (US)

(73) Assignee: Lam Research Corporation, Fremont, CA (US)

( * ) Notice: Subject to any disclaimer, the term of this patent is extended or adjusted under 35 U.S.C. 154(b) by 24 days.

This patent is subject to a terminal disclaimer.

(21) Appl. No.: 17/691,011

(22) Filed: Mar. 9, 2022

(65) Prior Publication Data

US 2022/0199366 A1 Jun. 23, 2022

Related U.S. Application Data

(63) Continuation of application No. 17/276,798, filed as application No. PCT/US2018/053383 on Sep. 28, 2018, now Pat. No. 11,335,539.

(51) Int. Cl.
*H01J 37/32* (2006.01)

(52) U.S. Cl.
CPC .. *H01J 37/32174* (2013.01); *H01J 37/32128* (2013.01); *H01J 37/32165* (2013.01); *H01J 37/32926* (2013.01)

(58) Field of Classification Search
None
See application file for complete search history.

(56) References Cited

U.S. PATENT DOCUMENTS 5,524,281 A * 6/1996 Bradley ................. G01R 27/28
455/67.15
5,835,458 A * 11/1998 Bischel ................ G11B 7/1353
369/44.29

(Continued)

FOREIGN PATENT DOCUMENTS

GB 2413869 A * 11/2005 ............... G06F 1/10
GB 2413870 A * 11/2005 ............... G06F 1/10

(Continued)

*Primary Examiner* — Srinivas Sathiraju
(74) *Attorney, Agent, or Firm* — PENILLA IP, APC

(57) ABSTRACT

A method for optimizing delivery of power to a plasma chamber is described. The method includes dividing each cycle of a low frequency (LF) radio frequency generator (RFG) into multiple time intervals. During each of the time intervals, a frequency offset of a high frequency (HF) RFG is generated for which the delivery of power is maximized. The frequency offsets provide a substantially inverse relationship compared to a voltage signal of the LF RFG for each cycle of the voltage signal. The frequency offsets for the time intervals are multiples of the low frequency. The substantially inverse relationship facilitates an increase in the delivery of power to the electrode. A total range of the frequency offsets from a reference HF frequency over the LF RF cycle depends on a power ratio of power that is supplied by the LF RFG and power that is supplied by the HF RFG.

20 Claims, 23 Drawing Sheets

(56) References Cited

U.S. PATENT DOCUMENTS

| | | | | |
|---|---|---|---|---|
| 6,972,524 | B1* | 12/2005 | Marakhtanov | H01J 37/32091 |
| | | | | 118/723 MR |
| 8,842,704 | B2* | 9/2014 | Schmelzer | H03F 3/602 |
| | | | | 372/63 |
| 10,002,746 | B1* | 6/2018 | Marakhtanov | H01J 37/32183 |
| 10,304,662 | B2* | 5/2019 | Marakhtanov | H01J 37/3244 |
| 10,504,744 | B1* | 12/2019 | Yanagawa | H01L 21/31116 |
| 10,615,003 | B2* | 4/2020 | Kellogg | H01J 37/32155 |
| 10,998,767 | B2* | 5/2021 | Ikefuji | H03F 3/2176 |
| 11,195,706 | B2* | 12/2021 | Marakhtanov | H01J 37/32183 |
| 11,335,539 | B2* | 5/2022 | Bhowmick | H01J 37/32128 |
| 11,424,539 | B2* | 8/2022 | Alpman | H03L 7/145 |
| 2005/0225365 | A1* | 10/2005 | Wood | G06F 1/12 |
| | | | | 327/141 |
| 2006/0216406 | A1* | 9/2006 | Hudson | H01J 37/32963 |
| | | | | 118/712 |
| 2008/0241420 | A1* | 10/2008 | Dhindsa | H01J 37/32642 |
| | | | | 427/569 |
| 2013/0122711 | A1* | 5/2013 | Marakhtanov | H01J 37/32165 |
| | | | | 438/711 |
| 2013/0170512 | A1* | 7/2013 | Schmelzer | H03L 7/0991 |
| | | | | 372/29.012 |
| 2015/0091440 | A1* | 4/2015 | Marakhtanov | H01J 37/32183 |
| | | | | 315/111.21 |
| 2016/0172216 | A1* | 6/2016 | Marakhtanov | H01J 37/32174 |
| | | | | 438/712 |
| 2018/0005802 | A1* | 1/2018 | Chen | H01J 37/32678 |
| 2018/0025891 | A1* | 1/2018 | Marakhtanov | H01L 21/68735 |
| | | | | 438/714 |
| 2018/0262049 | A1* | 9/2018 | Ikefuji | H02J 50/60 |
| 2019/0080885 | A1* | 3/2019 | Marakhtanov | H01J 37/3255 |
| 2019/0244788 | A1* | 8/2019 | Marakhtanov | H01J 37/32155 |
| 2019/0318919 | A1* | 10/2019 | Lyndaker | H01J 37/32935 |
| 2020/0091608 | A1* | 3/2020 | Alpman | H01Q 21/24 |
| 2021/0319980 | A1* | 10/2021 | Bhowmick | H01J 37/32926 |
| 2022/0199366 | A1* | 6/2022 | Bhowmick | H01J 37/32128 |
| 2022/0384956 | A1* | 12/2022 | Alpman | H01Q 1/48 |
| 2023/0007885 | A1* | 1/2023 | Marakhtanov | H01J 37/32935 |
| 2023/0145401 | A1* | 5/2023 | Alpman | H01L 23/66 |
| | | | | 343/700 MS |

FOREIGN PATENT DOCUMENTS

| | | | | |
|---|---|---|---|---|
| GB | 2414094 A | * | 11/2005 | G06F 1/10 |
| GB | 2419437 A | * | 4/2006 | G06F 1/10 |

* cited by examiner (Lab - empirical)

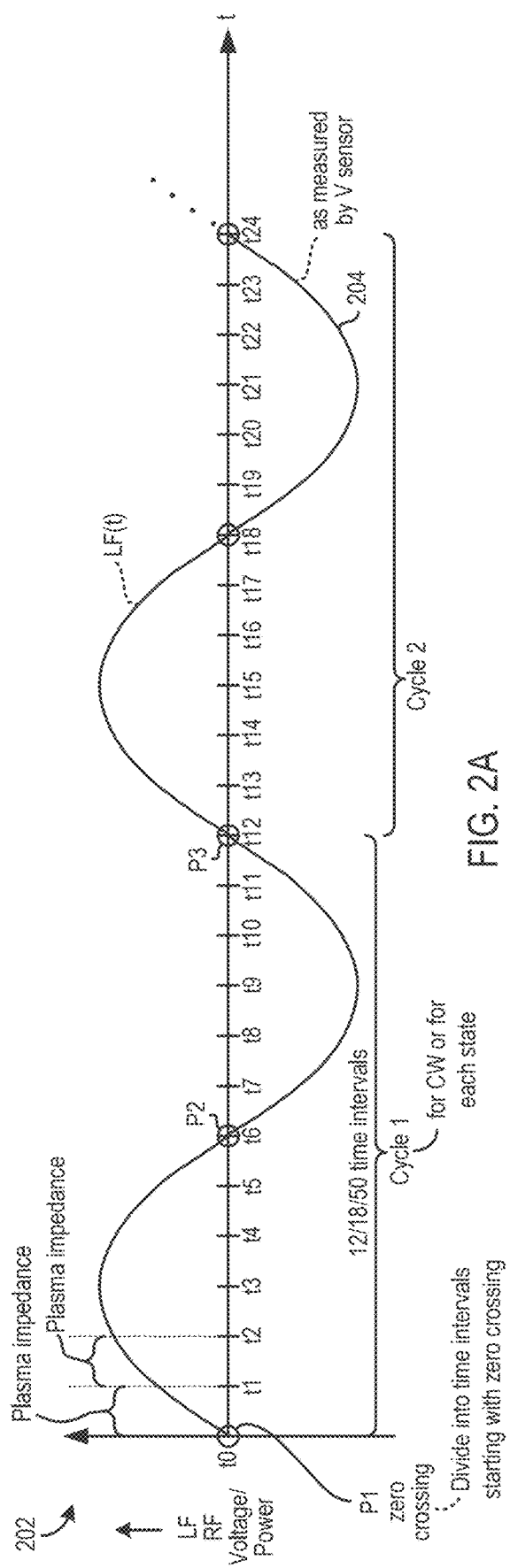
FIG. 2A (Lab)
FIG. 2B (Lab)

(Processing)

(Lab)

(Lab)

(Processing w. tuning of LF from $LF_H$ to ($LF_H + A$))

(Forward power distributed over several frequencies)

(Empirical)

(Back and forth between adjustment of C and determination
of HF offsets to increase $P_{del}$ for a cycle of LF RF signal)

(For a particular process, find HF offsets during time intervals t0-t1, t1-t2, t2-t3 ... t5-t6, t12-t13, t13-t14 ... t17-t18 corresponding to positive cycle portions of LF. The HF offsets correspond to $P_{del}$ being low during the time intervals)

(For a particular process, find HF offsets during time intervals t6-t7, t7-t8 ... t11-t12, t18-t19 ... t23-t24 corresponding to negative cycle portions of LF. The HF offsets correspond to $P_{del}$ being low during the time intervals)

SYSTEMS AND METHODS FOR OPTIMIZING POWER DELIVERY TO AN ELECTRODE OF A PLASMA CHAMBER

CLAIM OF PRIORITY

This application is a continuation of and claims priority, under 35 U.S.C. § 120, to U.S. patent application Ser. No. 17/276,798, filed on Mar. 16, 2021, and titled "Systems and Methods for Optimizing Power Delivery to an Electrode of a Plasma Chamber," which is a national stage filing of and claims priority, under 35 U.S.C. § 371, to PCT/US2018/053383, filed on Sep. 28, 2018, and titled "Systems and Methods for Optimizing Power Delivery to an Electrode of a Plasma Chamber", all of which are incorporated by reference herein in their entirety for all purposes.

FIELD

The present embodiments relate to systems and methods for optimizing power delivery to an electrode of a plasma chamber.

BACKGROUND

A plasma tool includes a radiofrequency generator (RFG), and impedance matching network, and a plasma chamber. The RFG generates power that is provided via the impedance matching network to the plasma chamber. When the power is being provided, a process gas is supplied to the plasma chamber for processing a wafer placed within the plasma chamber.

Sometimes, when the power is being provided to the plasma chamber, reflected power is generated. The reflected power is reflected from the plasma chamber towards the RFG. If the reflected power is high, processing of the wafer becomes inefficient.

It is in this context that embodiments described in the present disclosure arise.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Embodiments of the disclosure provide systems, apparatus, methods and computer programs for optimizing power delivery to an electrode of a plasma chamber. It should be appreciated that the present embodiments can be implemented in numerous ways, e.g., a process, an apparatus, a system, a device, or a method on a computer readable medium. Several embodiments are described below.

In some embodiments, the systems and methods described herein include performing very high frequency (VHF) frequency tuning. The VHF frequency tuning is performed by dividing a low frequency (LF) radio frequency (RF) period of a voltage or power signal generated by an LF RF generator (RFG) into multiple time intervals, which can be equally spaced, to mitigate high reflected power at intermodulated frequencies. A controlling or central time interval is aligned with an LF RF period at a positive crossover of the low frequency. After the alignment, the very high frequency is tuned at each of the time intervals. During tuning of the very high frequency, frequency offsets for the time intervals are multiples of the low frequency from a central very high frequency. The central very high frequency is a frequency at which the central time is aligned with the LF RF period at the positive crossover. Also, during tuning of the very high frequency, offset magnitude of the frequency offsets depend on a temporal position with respect to the LF RF period. A frequency offset from the central VHF for a time interval follows a trajectory depending on a position of the frequency offset with respect to the LF RF period. For example, a positive half of the LF RF period has a negative offset and a negative half of the LF RF period has a positive offset. To illustrate, the very high frequency is substantially inverse compared to the LF RF period.

In an embodiment, the total range of the frequency offsets is proportional to a power ratio between LF and the very high frequency. A total offset range of the frequency offsets for a time interval of the voltage of the LF RFG is proportional to the power ratio of power supplied by the LF RFG and power supplied by an HF RFG. The total range of the frequency offsets increases with an increase in the power ratio and decreases with a decrease in the power ratio. The total range varies for different processes, which have different LF to HF supplied power ratios. By changing the total range of frequency offsets, definite changes in plasma conditions or impedance conditions are counteracted. An optimization scheme in which the total range is varied is not random but has a definite trajectory.

In one embodiment, a frequency selection method to optimize power delivery in each of the time intervals and over the entire LF RF period is described. The time intervals are applied to a voltage sensed at an output of a match that is coupled to the LF RFG and an HF RFG. The HF RFG operates at the very high frequency. The central VHF is set at the central time interval and for all other time intervals, frequency values of the HF RFG are offset from the central VHF. For example, a frequency value of the HF RFG for an $i^{th}$ time interval is set to be $F(VHF, i) = f\_VHF_0 \pm n*F(LF)$, where $F(VHF, i)$ is a frequency of the HF RFG for the $i^{th}$ time interval, $f\_VHF_0$ is the central VHF, n is an integer or a positive real number, and $F(LF)$ is a frequency of the LF RFG during the $i^{th}$ time interval. The terms n and are used herein interchangeably.

In an embodiment, both the match and the HF RFG are controlled to optimize power delivery to the electrode. For example, a capacitor of the match and the HF RFG are controlled repeatedly to optimize the power delivery. To illustrate, after the power delivery is optimized using the HF RFG, the power delivery is optimized using the match. After the power delivery is optimized using the match, the power delivery is optimized using the HF RFG.

In an embodiment, the methods described herein for optimizing power delivery to the electrode of the plasma chamber are applied for pulsed RF signals that are generated by the LF RF generator and a VHF RF generator instead of continuous wave RF signals.

In one embodiment, the frequency offsets are applied to the VHF to a pre-designed fraction of the LF RF period. For example, the frequency offsets are applied to a first half of the LF RF period and not to a second half of the LF RF period or are applied to the second half and not to the first half.

Some advantages of the herein described systems and methods for optimizing delivery of power to the electrode include generating frequency offsets of the HF RFG for which the delivery of power is optimized for all of the time intervals. The frequency offsets that are generated trace a frequency signal that has a substantially inverse relationship with respect to the voltage of the LF RFG during each cycle of operation of the LF RFG. The substantially inverse relationship facilitates the optimal delivery of power.

Further advantages of the herein described systems and methods for optimizing delivery of power include controlling the match to optimize the delivery. Once frequency offsets of the HF RFG are optimized for power delivery, the match is controlled for optimization of the delivery of power. Once power delivery is optimized using the match, again frequency offsets of the HF RFG are controlled to optimize power delivery to the electrode.

Additional advantages of the herein described systems and methods include controlling delivery of power to the electrode. For example, for a process operation, during each time interval of the first half of the cycle of operation of the LF RFG, frequency offsets of the HF RFG are controlled to decrease power delivery to the electrode and during the second half of the cycle, frequency offsets of the HF RFG are controlled to increase the power delivery. As another example, for a different process operation, during each time interval of the first half of the cycle of operation of the LF RFG, frequency offsets of the HF RFG are controlled to increase power delivery to the electrode and during the second half of the cycle, frequency offsets of the HF RFG are controlled to decrease the power delivery.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2A is an embodiment of a graph to illustrate a voltage signal.

FIG. 2B is an embodiment of a graph to illustrate a frequency signal, which represents frequency offsets of an RF signal to be generated at an output of a high frequency radio frequency generator (HF RFG).

DETAILED DESCRIPTION

The following embodiments describe systems and methods for optimizing power delivery to an electrode of a plasma chamber. It will be apparent that the present embodiments may be practiced without some or all of these specific details. In other instances, well known operations have not been described in detail in order not to unnecessarily obscure the present embodiments.

Figure 1:
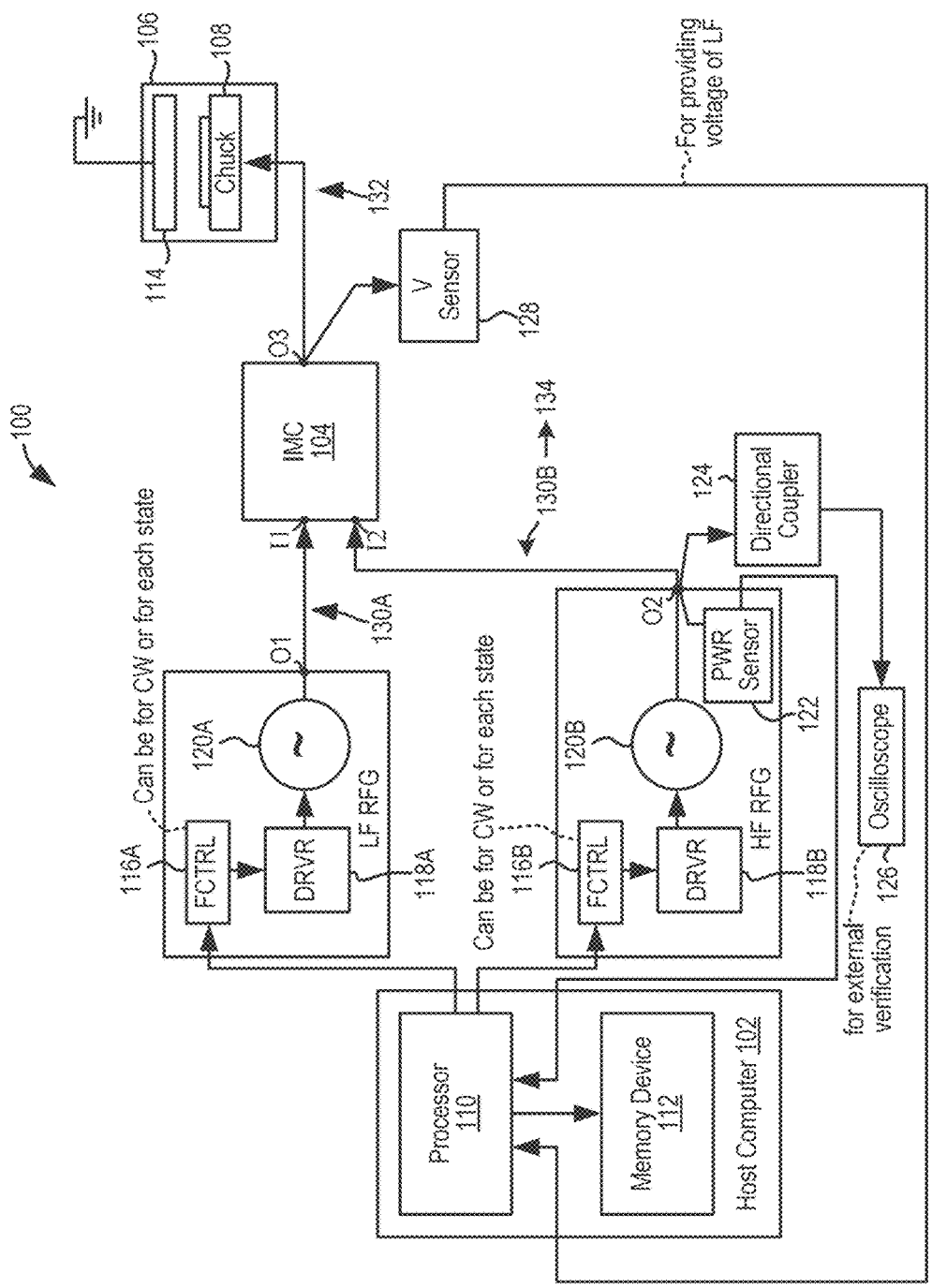
FIG. 1 is a block diagram of an embodiment of a system to optimize power to be delivered to a chuck a of a plasma chamber.

FIG. 1 is a block diagram of an embodiment of a system 100 to optimize power to be delivered to a chuck 108 of a plasma chamber 106. The system 100 includes a host computer 102, a low frequency (LF) radiofrequency generator (RFG), a high frequency (HF) RFG, an impedance matching circuit (IMC) 104, and the plasma chamber 106. It should be noted that the terms HF and very high frequency (VHF) are used herein interchangeably. Examples of the host computer 102 include a desktop computer, laptop computer, a smart phone, a controller, and a server. The host computer 102 includes a processor 110 and a memory device 112. As used herein, a processor is a controller, or an application specific integrated circuit (ASIC), or a programmable logic device (PLD), or a central processing unit (CPU), or a microcontroller, or a microprocessor, and these terms are used interchangeably herein. Examples of a memory device, as used herein, include a random access memory (RAM), a read-only memory (ROM), and a combination thereof. The processor 110 is coupled to the memory device 112.

The LF RFG can be a radiofrequency generator that operates in a kilohertz (kHz) frequency range. For example, the LF RFG operates at a frequency ranging from 300 kHz to 500 kHz. To illustrate, the LF RFG operates at a frequency of 370 kHz or 400 kHz or 450 kHz. The HF RFG can be a radiofrequency generator that operates in a megahertz (MHz) frequency range. As an example, the HF RFG operates at a frequency ranging from 50 MHz to 70 MHz or at a frequency ranging from 20 MHz to 30 MHz or at a frequency ranging from 12 MHz to 14 MHz or at a frequency ranging from 1 MHz to 3 MHz. The LF RFG includes a frequency controller (FCTRL) 116A, a driver (DRVR) 118A, and an RF power supply 120A. The frequency controller 116A is coupled to the driver 118A, which is coupled to the RF power supply 120A. An example of a driver includes one or more transistors. An example of an RF power supply includes an RF oscillator that oscillates at an RF frequency. The frequency controller 116A is coupled to the processor 110 and the RF power supply 120A is coupled via an output O1 of the LF RFG to an input I1 of the IMC 104.

Similarly, the HF RFG includes a frequency controller 116B, a driver 118B, and an RF power supply 120B. As shown, the frequency controller 116B is coupled to the driver 118B and the driver 118B is coupled to the RF power supply 120B. The frequency controller 116B is coupled to the processor 110 and the RF power supply 120B is coupled via an output O2 of the HF RFG to an input I2 of the impedance matching circuit 104. In addition, a power sensor 122 is coupled to the output O2 of the HF RFG. The power sensor 122 is coupled to the processor 110. Optionally, a directional coupler 124 is coupled to the output O2 and an oscilloscope 126 is coupled to the directional coupler 124.

The IMC 104 is sometimes referred to herein as a match or an impedance matching network. The IMC 104 has an output O3 that is coupled to a voltage sensor 128, which is coupled to the processor 110. Also, the output O3 is coupled to the chuck 108. The plasma chamber 106 is a capacitively coupled plasma (CCP) chamber and the chuck 108 can be an electrostatic chuck (ESC). The chuck 108 includes a lower electrode, which is made from a metal, such as aluminum or an alloy of aluminum. The plasma chamber 106 further includes an upper electrode 114 having a lower surface that faces an upper surface of the chuck 108. The upper electrode 114 is coupled to a ground potential and is made from the metal.

The system 100 is used to execute a method for optimizing power to be delivered to the plasma chamber 106. The method is an empirical method. An empirical method, as described herein, is executed during lab testing without processing a substrate within the plasma chamber 106. Examples of processing the substrate include depositing one or more materials on the substrate, or etching the substrate, or cleaning the substrate, or sputtering the substrate, or a combination thereof.

During execution of the method for optimizing power, the processor 110 accesses a recipe from the memory device 112. The recipe includes specified frequency and power of an RF signal 130A to be generated by the LF RFG and specified frequency and power of an RF signal 130B to be generated by the HF RFG. The processor 110 provides the specified frequency and power of the RF signal 130A to the frequency controller 116A and provides the specified frequency and power of the RF signal 130B to the frequency controller 116B. Upon receiving the frequency and power of the RF signal 130A to be generated, the frequency controller 116A sends a signal to the driver 118A to generate a current according to the specified frequency and power. The driver 118A generates the current and provides the current to the RF power supply 120A. Upon receiving the current, the RF power supply 120A generates the RF signal 130A having the specified frequency and power received from the processor 110.

Similarly, upon receiving the specified frequency and power of the RF signal 130B to be generated, the frequency controller 116B sends a signal to the driver 118B to generate a current based on the specified frequency and power. The driver 118B generates the current for providing to the RF power supply 120B. In response to receiving the current, the RF power supply 120B generates the RF signal 130B having the specified frequency and power received from the processor 110.

The RF power supply 120A supplies the RF signal 130A via the output O1 and the input I1 to the IMC 104 and the RF power supply 120B supplies the RF signal 130B via the output O2 and the input I2 to the IMC 104. The IMC 104 matches an impedance of a load coupled to the output O3 with an impedance of a source coupled to the inputs I1 and I2 and combines the RF signals 130A and 130B to generate a modified RF signal 132 at the output O3. An example of the load includes the plasma chamber 106 and an RF transmission line that couples the output O3 to the chuck 108. An example of the source includes the LF RFG, the HF RFG, an RF cable that couples the output O1 to the input I1, and an RF cable that couples the output O2 to the input I2. The modified RF signal 132 is supplied to the chuck 108.

When the modified RF signal 132 is supplied to the chuck 108, the voltage sensor 128 measures a voltage at the output O3 and provides measurements of the voltage having voltage amounts to the processor 110. The voltage measured by the voltage sensor 128 is of the RF signal 130A. The voltage sensor 128 measures a voltage of the modified RF signal 132 at the output O3 and the voltage of the modified RF signal 132 is primarily a voltage of the RF signal 130A. The RF signal 130A has more power than the RF signal 130B. The processor 110 receives the measurements of the voltage from the voltage sensor 128 and divides a cycle of a voltage signal tracing the voltage amounts into multiple time intervals. The time intervals are equal. For example, a first one of the time intervals has a time period that is equal to a time period of a second one of the time intervals and the second one of the time intervals is equal to a third one of the time intervals.

For each of the time intervals, the power sensor 122 measures power that is delivered at the output O2. For example, the power sensor 122 measures delivered power of the RF signal 130B. It should be noted that delivered power is a difference between forward power and reflected power. For example, delivered power of the RF signal 130B is a difference between power supplied at the output O2 by the HF RFG and power reflected at the output O2 towards the HF RFG. The power reflected at the output O2 is reflected from the plasma chamber 106 via the RF transmission line, the IMC 104, and the RF cable that couples the input I2 to the output O2. The power sensor 122 provides measurements of the power delivered at the output O2 to the processor 110.

For each of the time intervals, the processor 110 determines a frequency of the HF RFG for which power delivered at the output O2 is maximum. For example, for the first one of the time intervals, the processor 110 determines from the measurements that power delivered at the output O2 is PWR1 when the HF RFG has the frequency, such as a reference frequency, of the recipe. An example of a reference frequency is a fundamental frequency, such as a frequency value HF0, further described below. As another example, the reference frequency of the HF RFG is a frequency at which a zero positive crossing at an initial point P1, further described below, occurs. The zero positive crossing is also further described below. The initial point P1 occurs at a central time. Moreover, during the first one of the time intervals, the processor 110 modifies the frequency within the recipe to a modified frequency and provides the modified frequency to the frequency controller 116B. [The modified frequency is provided to the frequency controller 116B to optimize delivery of power to the plasma chamber 106 and to reduce power reflected towards the HF RFG. During the first one of the time intervals, the frequency controller 116B controls the RF power supply 120B to generate an RF signal 134 having the modified frequency in the same manner in which the frequency controller 116B controls the RF power supply 120B to generate the RF signal 130B. For the first one of the time intervals, when the RF signal 134 is supplied at the output O2, the processor 110 determines from the measurements that power delivered at the output O2 is PWR2. If the processor 110 determines that PWR2 is greater than PWR1, then the processor 110 would further determine that the HF RFG is to be operated at the modified frequency instead of the reference frequency during the first one of the time intervals of the cycle of the voltage signal. On the other hand, if the processor 110 determines that PWR1 is greater than PWR2, then the processor 110 would further determine that the HF RFG is to be operated at the reference frequency instead of the modified frequency during the first one of the time intervals of the cycle of the voltage signal.

It should be noted that the directional coupler 124 and the oscilloscope 126 are used for verification purposes and are optional devices. For example, the directional coupler 124 couples power delivered at the output O2 to provide the power to the oscilloscope 126. A user can view measurements of the power delivered at the output O2 and frequency values of the RF signal 130B or 134 on the oscilloscope 126 to verify the reference frequency or the modified frequency for which the power delivered is greater.

In an embodiment, instead of the upper electrode 114 being coupled to the ground potential, the upper electrode 114 is coupled to one or more RF generators (not shown) via an impedance matching circuit (not shown) and the chuck 108 is coupled to the LF RFG and the HF RFG via the IMC 104.

In one embodiment, instead of being coupled to the ground potential, the upper electrode 114 is coupled to the one or more RF generators (not shown) via the impedance matching circuit (not shown) and the chuck 108 is coupled to the ground potential.

In an embodiment, instead of the voltage sensor 128 being coupled to the output O3, the voltage sensor 128 is coupled to the output O1 or the input I1.

In one embodiment, the time intervals of the voltage signal having the voltage amounts measured by the voltage sensor 128 are unequal. For example, the first one of the time intervals has a shorter or longer time period compared to a time period of the second one of the time intervals.

FIG. 2A is an embodiment of a graph 202 to illustrate a voltage signal 204. The voltage signal 204 is generated by the processor 110 of FIG. 1 from measurements of a voltage at the output O3. The measurements of the voltage at the output O3 are made by the voltage sensor 128 of FIG. 1. The graph 202 plots a voltage of the voltage signal 204 versus time t. The voltage is of the RF signal 130A of FIG. 1. The voltage measured by the voltage sensor 128 is of the modified RF signal 132 and as explained above, voltage of the modified RF signal 132 primarily includes voltage of the RF signal 130A.

The processor 110 divides a cycle 1 of the voltage signal 204 into multiple time intervals from t0 to t12. Each of the time intervals from t0 to t12 is equal. For example, a time period between the times t0 and t1 is the same as the time period between the times t1 and t2 and the time period between the times t1 and t2 is the same as a time period between the times t2 and t3. The time interval between the times t0 and t1 is sometimes referred to herein as a central time interval. Similarly, the processor 110 divides another cycle 2 of the voltage signal 204 into multiple time intervals from t12 to t24. The cycle 2 is consecutive to the cycle 1 and the cycle 1 precedes the cycle 2. It should be noted that a cycle, described herein, is sometimes referred to herein as a waveform cycle. For example, the cycle 1 is of the voltage signal 204, which is a waveform.

It should be noted that the initial point P1 of the voltage signal 204 is at the time t0 and occurs at a positive zero crossing of the voltage signal 204. For example, at the initial point P1, values of the voltage signal 204 swing from being negative to being positive. The voltage signal 204 has a positive slope at the initial point P1 at which the positive zero crossing occurs. Moreover, a midpoint P2 of the voltage signal 204 is at the time t6 and occurs at a negative zero crossing of the voltage signal 204. The voltage signal 204 has a negative slope at the midpoint P2 at which the negative zero crossing occurs. As an example, at the midpoint P2, values of the voltage signal 20 swing from being positive to being negative. Similarly, an endpoint P3 of the voltage signal 204 occurs at a positive zero crossing of the voltage signal 204. For example, at the endpoint P3, values of the voltage signal 204 swing from being negative to being positive. The voltage signal 204 has a positive slope at the endpoint P3 at which the positive zero crossing occurs. The endpoint P3 is an initial point of the cycle 2 of the voltage signal 204. The negative zero crossing that occurs at the midpoint P2 is between the positive zero crossing that occurs at the initial point P1 and the positive zero crossing that occurs at the endpoint P3. The points P1 through P3 occur during the cycle 1 of the voltage signal 204.

The positive zero crossing of the cycle 1 at the initial point P1 corresponds to the initial point P1. Similarly, the negative zero crossing of the cycle 1 at the mid point P2 corresponds to the mid point P2 and the positive zero crossing of the cycle 1 at the end point P3 corresponds to the end point P3.

The cycle 1 of the voltage signal 204 is positive between the points P1 and P2 and is negative between the points P2 and P3. For example, the voltage signal 204 has positive values or positive amplitudes or positive magnitudes between the points P1 and P2 and has negative values between the points P2 and P3. Similarly, half of the cycle 2 is positive and the remaining half of the cycle 2 is negative.

It should further be noted that the cycle 1 is associated with a continuous wave (CW) RF signal or a multistate RF signal. For example, the RF signal 130B of FIG. 1 is a continuous wave RF signal or is a level-to-level pulsed RF signal during the cycle 1. The multistate RF signal transitions from one state to another. As an example, an envelope of the multistate RF signal during a high state has a greater power level than an envelope of the multistate RF signal during a low state. An envelope is a peak-to-peak amplitude or a zero-to-peak amplitude.

In an embodiment, the processor 110 divides each cycle of the voltage signal 204 into any other number of time intervals. For example, the processor 110 divides each cycle of the voltage signal 204 into 18 time intervals or 50 time intervals instead of 12 time intervals.

FIG. 2B is an embodiment of a graph 206 to illustrate a frequency signal 208, which represents frequency offsets of the RF signal 134 (FIG. 1) to be generated at the output O2 by the HF RFG of FIG. 1. The frequency signal 208 is generated by applying the empirical method, described above. By applying the frequency offsets of the HF RFG, the processor 110 provides the frequency signal 208. The frequency signal 208 is sometimes referred to herein as a frequency adjusting waveform. The frequency offsets of the frequency signal 208 are determined after applying the method, illustrated with respect to FIG. 1, for optimizing power to be delivered to the plasma chamber 106 of FIG. 1. For example, during the time interval between the times t0 and t1, power delivered at the output O2 is maximum when the HF RFG is operated at a frequency offset HF-1 and during the time interval between the times t1 and t2, power delivered at the output O2 is maximum when HF RFG is operated at a frequency offset HF-2. In a similar manner, the frequency offsets HF-3, HF-1, HF-1, HF0, HF1, HF2, HF3, HF3, HF2, and HF0 are determined corresponding to the time intervals between the times t2 and t3, t3 and t4, t4 and t5, t5 and t6, t6 and t7, t7 and t8, t8 and t9, t9 and t10, t10 and t11, and t11 and t12 of the cycle 1 of the voltage signal 204.

It should be noted that the frequency signal 208 has a substantially inverse shape compared to a shape of the voltage signal 204. For example, for a majority of a time period between the times t0 and t6, when the voltage signal 204 has positive values, the frequency signal 208 has negative offsets with respect to the reference frequency, represented as $HF_{rf}(t)$. Also, for a majority of a time period between the times t6 and t12, when the voltage signal 204 has negative values, the frequency signal 208 has positive offsets with respect to the reference frequency $HF_{rf}(t)$. As an illustration, the majority of the time period between the times t0 and t6 is a time period that is greater than half of the time period between the times t0 and t6 and the majority of the time period between the times t6 and t12 is a time period that is greater than half of the time period between the times t6 and t12. As another example, the voltage signal 204 has the positive zero crossing at the initial point P1, which occurs at the time t0. At the time t0, the frequency signal 208 has a negative zero crossing and changes its offsets with respect to the reference frequency $HF_{rf}(t)$ from being positive to being negative. Moreover, the voltage signal 204 has the negative zero crossing at the midpoint P2, which occurs at the time t6. At the time t6, the frequency signal 208 has a positive zero crossing and changes its offsets with respect to the reference frequency $HF_{rf}(t)$ from being negative to being positive. Also, the voltage signal 204 has the positive zero crossing at the endpoint P3, which occurs at the time t12. At the time t12, the frequency signal 208 has a negative zero crossing and changes its offsets with respect to the reference frequency $HF_{rf}(t)$ from being positive to being negative.

It should be noted that in one embodiment, the frequency signal 208 does not have the positive zero crossing at the time t6. For example, the frequency signal 208 has the positive zero crossing at a time that is near the time t6. To illustrate, the frequency signal 208 has the positive zero crossing at a time between the times t4 and t8 or between the times t5 and t7. Similarly, the frequency signal 208 does not have the negative zero crossing at the time t0 or at the time t12. As an example, the frequency signal 208 has the negative zero crossing at a time that is near the time t0 or the time t12. To illustrate, for the initial point P1, the frequency signal 208 has the negative zero crossing at a time between the times t0 and t2. As another illustration, for the endpoint P3, the frequency signal 208 has the negative zero crossing at a time between the times t11 and t13 or between the times t10 and t14.

In addition, in an embodiment, the frequency signal 208 has the positive zero crossing near the time t6 and has an offset that is near the frequency offset HF0. For example, the frequency signal 208 has a frequency offset between the offsets HF-1 and HF1 near the time t6. Similarly, the frequency signal 208 has the negative zero crossing near the time t0 or t12 and has an offset that is near the frequency offset HF0. To illustrate, the frequency signal 208 has a frequency offset between the offsets HF-1 and HF1 near the time t0 and has a frequency offset between the offsets HF-1 and HF1 near the time t12.

Figure 2C:
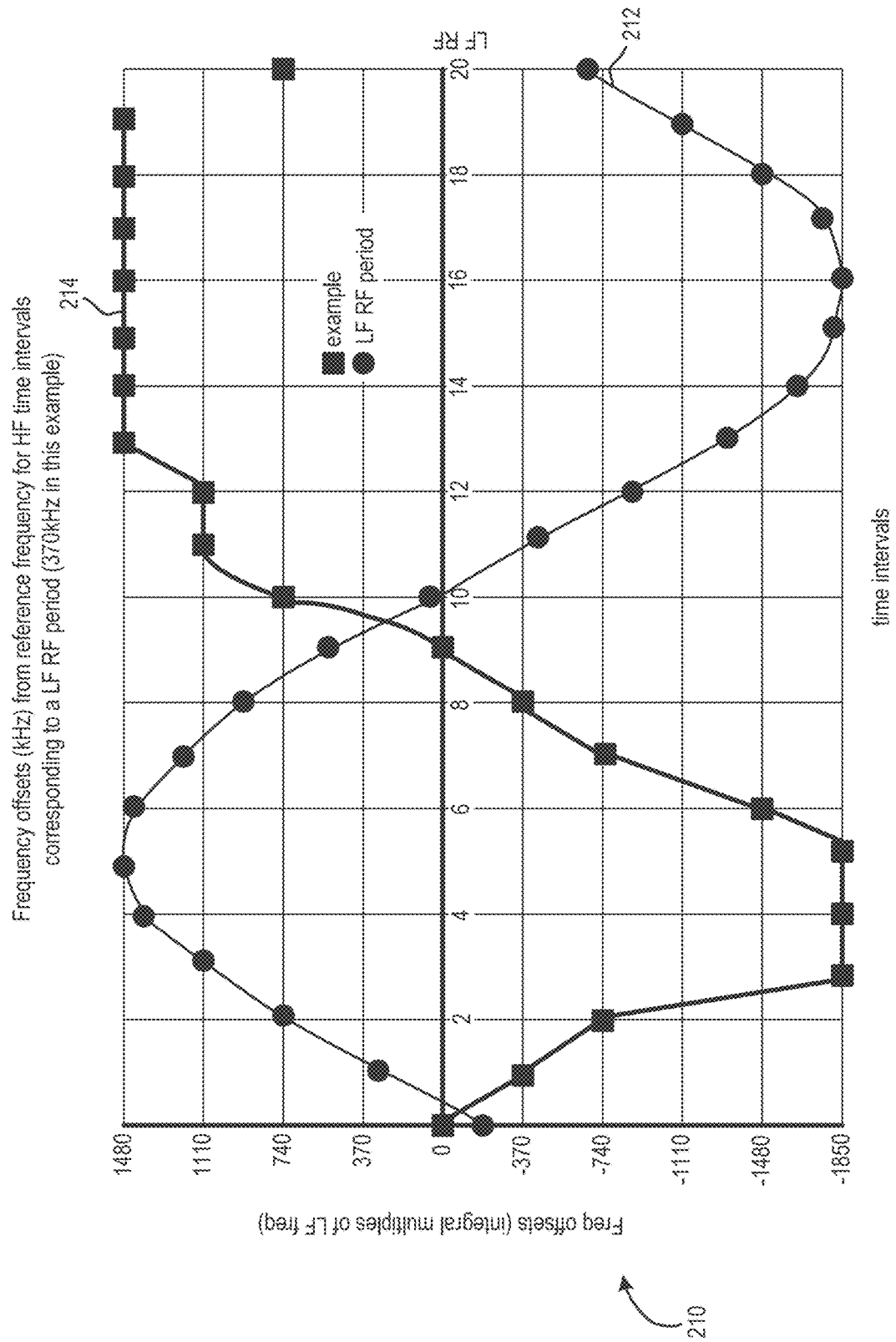
FIG. 2C is an embodiment of a graph to illustrate a voltage signal having voltage amounts that are measured by a voltage sensor and a frequency signal that is substantially inverted compared to the voltage signal.

FIG. 2C is an embodiment of a graph 210 to illustrate a voltage signal 212 having voltage amounts that are measured by the voltage sensor 128 of FIG. 1 and a frequency signal 214 that is substantially inverted compared to the voltage signal 212. The graph 210 plots multiple frequency offsets of the frequency signal 214 from the reference frequency $HF_{rf}(t)$ versus the time t and plots the voltage amounts of the voltage signal 212 versus the time t. The reference frequency $HF_{rf}(t)$ is illustrated as 0 in the graph 210. The frequency signal 214 has the frequency offsets of an RF signal to be generated at the output O2 of the HF RFG of FIG. 1 and the frequency offsets are determined using the method, described above with reference to FIGS. 1 and 2B, for optimizing power to be delivered to the plasma chamber 106 of FIG. 1. It should be noted that the frequency signal 214 has a positive zero slope approximately at a beginning of a ninth time interval and the voltage signal 212 has a negative zero slope approximately at a beginning of a tenth time interval. For example, the frequency signal 214 has a slope that is positive and that occurs close to the beginning of the ninth time interval and the voltage signal 212 has a slope that is negative and occurs close to the beginning of the tenth time interval. The beginning of the tenth time interval is near the beginning of the ninth time interval.

Figure 3:
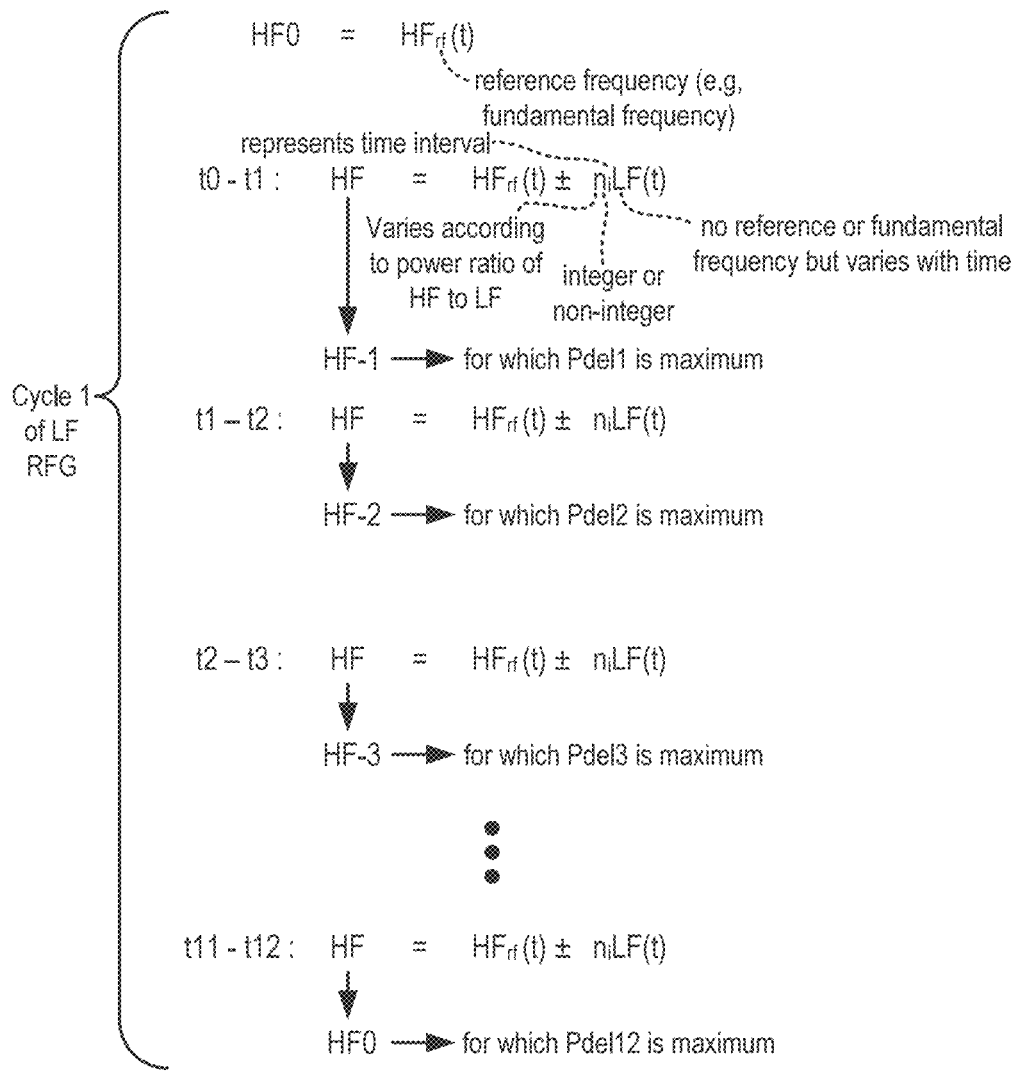
FIG. 3 is a diagram to illustrate generation of multiple frequency offsets at which the HF RFG is to be operated during processing of a substrate.

FIG. 3 is a diagram to illustrate generation of multiple frequency offsets at which the HF RFG of FIG. 1 is to be operated during processing of the substrate. The frequency offsets to be applied by the HF RFG are generated by executing the empirical method in which the substrate is not being processed. The frequency offsets are generated by applying the method for optimizing power to be delivered to the plasma chamber 106 of FIG. 1. For the time interval between the times t0 and t1, the processor 110 of FIG. 1 determines the frequency offset HF-1 for which an amount of power Pdel1 that is delivered by the HF RFG via the output O2 of FIG. 1 is maximum among multiple amounts of power is delivered by the HF RFG via the output O2. For example, during a time $t_{o1A}$, which is within the time interval between the times t0 and t1, the processor 110 controls the RF power supply 120B of the HF RFG to generate, at the output O2, an RF signal having a frequency offset HF-11. The reference frequency $HF_{rf}(t)$ is adjusted by the processor 110 to change to HF-11. The frequency offset HF-11 is generated by the processor 110 by determining a result of a difference between the reference frequency $HF_{rf}(t)$ and a product of an integer $n_i$ and a frequency value $LF(t_{o1A})$ of operation of the RF power supply 120A of the LF RFG, where i represents an integer of the time interval between the times t0 and t1 and is equal to a first integer. In this example, i is equal to one, which represents that the time interval between the times t0 and t1 is a first one of multiple time intervals during the cycle 1 of the voltage signal 204 of FIG. 2B. It should be noted that the reference frequency $HF_{rf}(t)$ is a function of the time t and varies with time. For example, the reference frequency $HF_{rf}(t)$ varies over one or more cycles of the voltage signal 204 of FIG. 2A. A calculation of a difference between two values is sometimes referred to herein as a subtraction operation. The processor 110 performs subtraction or product operations described herein. The frequency value $LF(t_{o1A})$ is of operation of the RF power supply 120A during the time $t_{o1A}$. During the time $t_{o1A}$ at which the RF power supply 120B is controlled to generate the RF signal having the frequency offset HF-11, power that is delivered at the output O2 is measured by the power sensor 122 of FIG. 1 to be Pdel11.

Moreover, during another time tom, which is also within the time interval between the times t0 and t1, the processor 110 controls the RF power supply 120B of the HF RFG to generate, at the output O2, an RF signal having the frequency offset HF-1. The frequency offset HF-1 is a difference between the reference frequency $HF_{rf}(t)$ and a product of the integer $n_i$ and a frequency value $LF(t_{o1B})$ of operation of the RF power supply 120A of the LF RFG, where i is equal to one and $n_i$ is equal to a second integer, which has a different value from the first integer. The processor 110 changes values of $n_i$ during any time interval, described herein to determine a frequency offset of the HF RFG for which power delivered at the output O1 is maximized for the time interval. The reference frequency $HF_{rf}(t)$ is adjusted by the processor 110 to change to HF-1. The frequency value $LF(t_{o1B})$ is of operation of the RF power supply 120A during the time $t_{o1B}$. During the time $t_{o1B}$ at which the RF power supply 120B is controlled to generate the RF signal having a frequency offset equal to a difference between the reference frequency value $HF_{rf}(t)$ and a product of the integer $n_i$ and the frequency value $LF(t_{o1B})$, power that is delivered at the output O2 is measured by the power sensor 122 to be Pdel1. The processor 110 determines that the power Pdel1 is greater than the power Pdel11. When the power Pdel1 is determined to be greater than the power Pdel11, the processor 110 determines that the RF power supply 120B is to be operated at the frequency offset HF-1 instead of the frequency offset HF-11 during the time interval between the times t0 and t1.

In a similar manner, the processor 110 determines that the RF power supply 120B of the HF RFG is to be operated at the frequency offset HF-2 during the time interval between the times t1 and t2 of the cycle 1 of the voltage signal 204. At a time at which the HF RFG is operated at the frequency offset HF-2, the power sensor 122 measures a maximum amount Pdel2 of power delivered at the output O2 for the time interval between the times t1 and t2. For example, the processor 110 determines that when the HF RFG is operated at the frequency offset HF-2, power delivered at the output O2 of the HF RFG is greater than power delivered at the output O2 for another frequency offset HF-22 of operation of the HF RFG for the time interval between the times t1 and t2. The frequency offset HF-22 is a difference between the reference frequency $HF_f(t)$ and a product of the integer $n_i$ and a frequency value $LF(t_{12A})$ of the RF power supply 120A of the LF RFG, where $n_i$ is a third integer. The reference frequency $HF_{rf}(t)$ is adjusted by the processor 110 to change to HF-22. The third integer can be the first integer, or the second integer, or another integer that is not equal to the first or second integer. The time $t_{12A}$ is a time during the time interval between the times t1 and t2. Moreover, the frequency offset HF-2 is a difference between the reference frequency $HF_{rf}(t)$ and a product of the integer $n_i$ and another frequency value $LF(t_{12B})$ of the RF power supply 120A of the LF RFG, where $n_i$ is a fourth integer unequal to the third integer. The time $t_{12B}$ is another time during the time interval between the times t1 and t2. The fourth integer can be the first integer, or the second integer, or another integer that is not equal to the first or second or third integer.

Moreover, the processor 110 determines that the RF power supply 120B of the HF RFG is to be operated at the frequency offset HF-3 during the time interval between the times t2 and t3 upon determining that the frequency offset HF-3 corresponds to a maximum amount Pdel3 of power delivered at the output O2 for the time interval between the times t2 and t3. The processor 110 continues such determinations for the time intervals between the times t3 and t4, times t4 and t5, and times t5 and t6. For example, the processor 110 determines frequency offsets for each of the time intervals between the times t3 and t4, times t4 and t5, and times t5 and t6. The frequency offset for each of the time intervals from the time t3 to the time t6 is determined by subtracting a product of the integer for the time interval and a frequency of operation LF(t) during the time interval from the reference frequency $HF_{rf}(t)$.

The processor 110 makes a further determination of frequency offsets of the HF RFG for the time interval between the times t6 and t7 associated with the cycle 1 of operation of the LF RFG. For the time interval between the times t6 and t7, the processor 110 of FIG. 1 determines the frequency offset HF1 for which an amount of power Pdel7 that is delivered by the HF RFG via the output O2 of FIG. 1 is maximum among multiple amounts of power delivered by the HF RFG via the output O2. For example, the reference frequency $HF_{rf}(t)$ is adjusted by the processor 110 to change to HF11. During a time $t_{07A}$ within the time interval between the times t6 and t7, the processor 110 controls the RF power supply 120B of the HF RFG to generate, at the output O2, an RF signal having the frequency offset HF11, which is a sum or an addition of the reference frequency, represented as $HF_{rf}(t)$, and a product of the integer and a frequency value $LF(t_{07A})$ of operation of the RF power supply 120A of the LF RFG, where i represents an integer of the time interval between the times t6 and t7 and is equal to a seventh integer. The processor 110 performs any addition operations described herein. In this example, i is equal to seven, which represents that the time interval between the times t6 and t7 is a seventh one of multiple time periods during the cycle 1 of the voltage signal 204 of FIG. 2B. The frequency value $LF(t_{07A})$ is of operation of the RF power supply 120A during the time $t_{07A}$. During the time $t_{07A}$ at which the RF power supply 120B is controlled to generate the RF signal having the frequency offset HF11, power that is delivered at the output O2 is measured by the power sensor 122 to be Pdel17.

Moreover, during another time $t_{07B}$, which is also within the time interval between the times t6 and t7, the processor 110 controls the RF power supply 120B of the HF RFG to generate, at the output O2, an RF signal having the frequency offset HF1. The frequency offset HF1 is a sum of the reference frequency $HF_{rf}(t)$ and a product of the integer and a frequency value $LF(t_{07B})$ of operation of the RF power supply 120A of the LF RFG, where i is equal to seven and is equal to an eighth integer. The eighth integer is not equal to the seventh integer. In this manner, the reference frequency $HF_{rf}(t)$ is adjusted by the processor 110 to change to HF1. The frequency value $LF(t_{07B})$ is of operation of the RF power supply 120A during the time tom. During the time tom at which the RF power supply 120B is controlled by the processor 110 to generate the RF signal having the frequency offset HF1 equal to the sum of the reference frequency value $HF_{rf}(t)$ and the product of the integer and the frequency value LF(tom), power that is delivered at the output O2 is measured by the power sensor 122 to be Pdel7. The processor 110 determines that the power Pdel7 is greater than the power Pdel17. When the power Pdel7 is determined to be greater than the power Pdel17, the processor 110 determines that the RF power supply 120B is to be operated at the frequency offset HF1 instead of the frequency offset HF11 during the time interval between the times t6 and t7.

The processor 110 continues to make such determinations for the time periods between the times t7 and t8, times t8 and t9, times t9 and t10, and times t10 and t11 associated with the cycle 1 of operation of the LF RFG. For example, the processor 110 determines frequency offsets for each of the remaining time intervals between the t7 and t8, times t8 and t9, times t9 and t10, and times t10 and t11 associated with the cycle 1 of operation of the LF RFG. The frequency offset for each of the remaining time intervals from the times t7 through t11 is determined by adding a product of integer values for the time interval and frequency values of operation LF(t) during the time interval to the reference frequency $HF_{rf}(t)$. Also, the processor 110 determines that the RF power supply 120B of the HF RFG is to be operated at the frequency offset HF0 during the time period between the times t11 and t12 of the cycle 1 upon determining that the frequency offset HF0 corresponds to a maximum amount Pdel12 of power delivered at the output O2 for the time interval between the times t11 and t12.

It should be noted that the frequency offset HF-1 corresponds to the time interval between the times t0 and t1. For example, during processing of the substrate and during the time interval between the times t0 and t1 of the voltage signal 204 that is supplied by the LF RFG, the HF RFG is operated at a frequency equal to a difference between the frequency $HF_{rf}(t)$ and the frequency offset HF-1. Similarly, the remaining frequency offsets HF-2, HF-3, HF-1, HF-1, HF0, HF1, HF2, HF3, HF3, HF2, and HF0 correspond to the remaining time intervals between the times t1 and t2, t2 and t3, t3, and t4, t4 and t5, t5 and t6, t6 and t7, t7 and t8, t8 and t9, t9, and t10, t10 and t11, and t11 and t12.

The frequency offsets for operation of the RF power supply 120B for the time intervals from t0 through t12 are stored in a table 1 of the memory device 112 by the processor 110. The frequency offsets stored within the table 1 are the same as the frequency offsets of the frequency signal 208 of FIG. 2C. The table 1 is further described below. The frequency offsets of the RF power supply 120B for the time intervals from t0 through t12 are for generation of the RF signal 134, which is a continuous wave RF signal that has no states. In addition, the RF signal 130A is a continuous wave RF signal.

It should be noted when the HF RFG operates at the frequency offsets illustrated in the table 1, the frequency signal 208 is optimized for the operating frequency LF(t) of the LF RFG. By optimizing power delivery for the time interval between the times t0 through t1, the time interval between the times t1 through t2, the time interval between the times t2 through t3, the time interval between the times t3 through t4, the time interval between the times t5 through t6, the time interval between the times t6 through t7, the time interval between the times t7 through t8, the time interval between the times t8 through t9, the time interval between the times t9 through t10, the time interval between the times t10 through t11, and the time interval between the times t11 through t12 of the cycle 1 of operation of the LF RFG, power delivery to the plasma chamber 106 is optimized.

In an embodiment, is a non-integer, such as a positive real number.

In one embodiment, a range with which the integer or non-integer is varied by the processor 110 is a function of a power ratio of an amount of power supplied by the LF RFG and an amount of power supplied by the HF RFG. For example, as the power ratio increases, the range with which the integer or non-integer $n_i$ is varied increases and as the power ratio decreases, the range with which the integer or non-integer is varied decreases. The increase or the decrease in the power ratio is a function of a process that is applied to a substrate within the plasma chamber 106. The range of variation in the integer or non-integer controls a total range of frequency offsets of the HF RFG. For example, the greater the range of variation in the integer or non-integer $n_i$ the greater the total range of frequency offsets and the smaller the range of variation in the integer or non-integer $n_i$ the smaller the total range of frequency offsets. To illustrate, when the range of variation in the integer or non-integer is greater, the total ranges of frequency offsets is between HF3 and HF-3 and when the range of variation in the integer or non-integer $n_i$ is smaller, the total ranges of frequency offsets is between HF2 and HF-2.

In one embodiment, multiple frequency offsets of the RF power supply 120B determined by the processor 110 for a portion of the time intervals from t0 through t12 are for generation of a first state of a multistate RF signal. The multistate RF signal is generated by the RF power supply 120B. In the same manner in which the frequency offsets are generated for a first portion illustrated by the first state, frequency offsets of the RF power supply 120B for the remaining portion of the time intervals t0 through t12 are generated for a second state of the multistate RF signal. The frequency offsets for each state are determined by a reference frequency of the HF RFG for that state and frequency values of the LF RFG for that state. An example of the first portion includes the time intervals from the time t0 to t6 and an example of the remaining portion includes the time intervals from the time t6 to t12. Another example of the first portion includes the time intervals from the time t0 to t5 and an example of the remaining portion includes the time intervals from the time t5 to t12. During the first state, the multistate RF signal has a greater power level, such as a peak-to-peak amplitude or an envelope or a zero-to-peak amplitude, compared to a power level of the multistate RF signal during the second state. The multistate RF signal periodically transitions from the first state to the second state.

Figure 4:
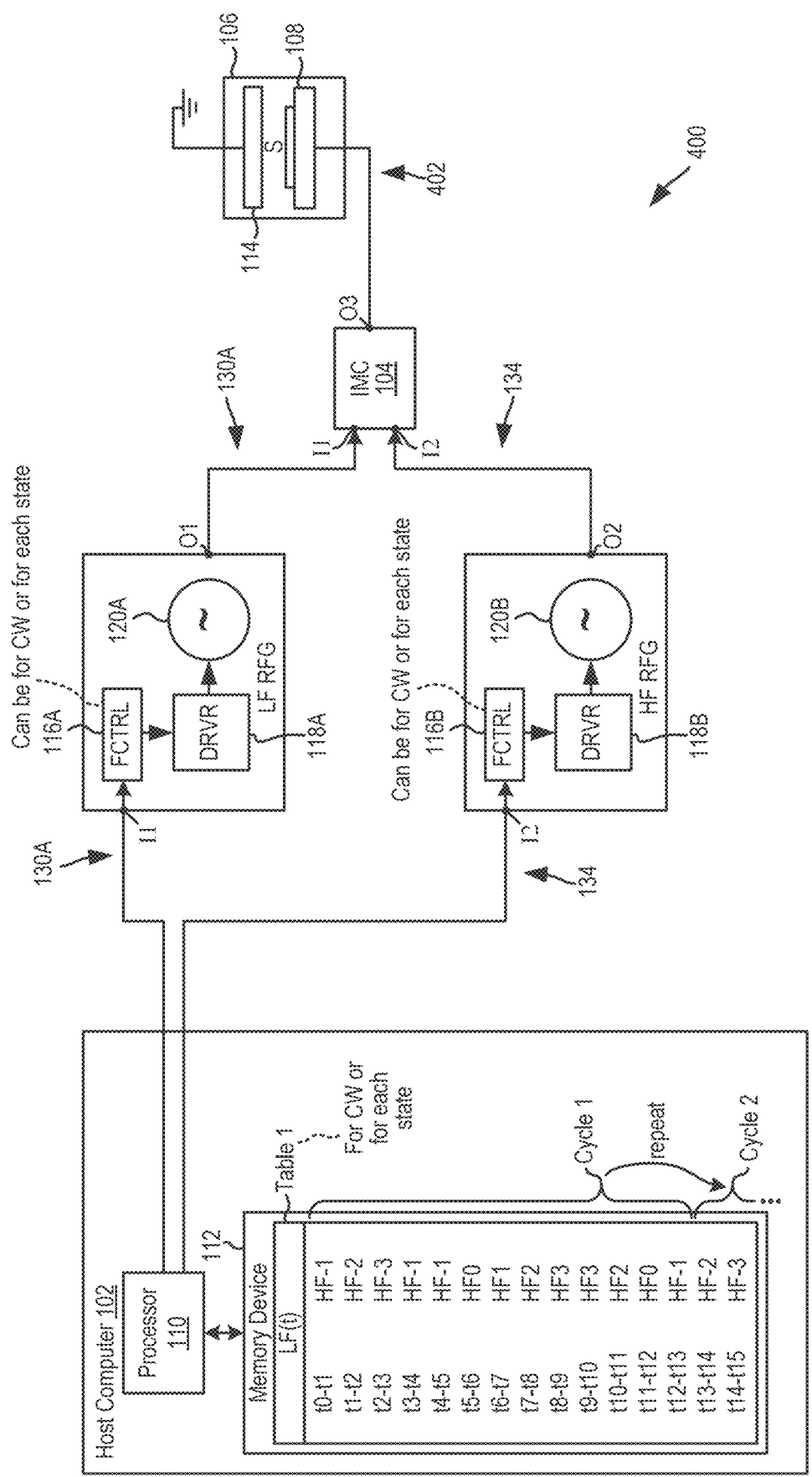
FIG. 4 is a diagram of an embodiment of a system to illustrate application of the frequency offsets, of FIG. 3, that are generated from a method for optimizing power to be delivered to a plasma chamber.

FIG. 4 is a diagram of an embodiment of a system 400 to illustrate application of the frequency offsets that are generated from the method for optimizing power to be delivered to the plasma chamber 106 of FIG. 1 for processing a substrate S. The frequency offsets of the HF RFG for the cycle 1 of the voltage signal 121 of FIG. 2A are stored in the table 1 within the memory device 112. For example, the frequency offsets of the frequency signal 204 of FIG. 2B are stored in the table 1. The table 1 is an example of a database.

To process the substrate S, such as a semiconductor wafer, which is placed on a top surface of the chuck 108, the processor 110 provides the recipe to the frequency controller 116A. The frequency controller 116A controls the RF power supply 120A via the driver 118A to generate the RF signal 130A. The RF signal 130A is supplied from the RF power supply 120A via the output O1 and the input I1 to the IMC 104.

Moreover, the processor 110 provides the frequency offsets within the table 1 to the frequency controller 116B for application of the frequency offsets during each cycle, such as the cycle 1, of operation of the RF signal 130A. When the LF RFG is operating at the specific frequency LF(t), the processor 110 provides the frequency offsets stored in the table 1 to the HF RFG to adjust the reference frequency $HF_{rf}(t)$ of the HF RFG during each of the time intervals during the cycle of operation of the RF signal 130A. The frequency offsets stored in the table 1 correspond to the specific frequency LF(t) of the LF RFG. The processor 110 sets a frequency of an RF generator, such as the HF RFG or the LF RFG, by providing frequency offsets to the RF generator. The frequency offsets determined for the cycle 1 of the voltage signal 204 of FIG. 2A are to be repeated for each additional cycle of the RF signal 130A to process the substrate S. For example, the frequency offset HF-1 is to be applied during a time interval between times t12 and t13 and the frequency offset HF-2 is to be applied during a time interval between times t13 and t14 of the cycle 2 of operation of the LF RFG.

The frequency controller 116B controls the RF power supply 120B via the driver 118B to generate the RF signal 134 having the frequency offsets stored within the table 1 for each cycle, such as the cycle 1 or the cycle 2, of operation of the LF RFG to process the substrate S. For example, during the time period between the times t0 and t1 of the cycle 1 of the RF signal 130A, the RF power supply 120B supplies a first portion of the RF signal 134 having the frequency offset HF-1 of the frequency adjusting waveform to tune or change the reference frequency $HF_{rf}(t)$ and during the time period between the times t1 and t2 of the cycle 1, the RF power supply 120B supplies a second portion of the RF signal 134 having the frequency offset HF-2 of the frequency adjusting waveform to tune or change the reference frequency $HF_{rf}(t)$. To further illustrate, during the time period between the times t0 and t1 of the cycle 1 of the RF signal 130A, the RF power supply 120B supplies the first portion of the RF signal 134 having a frequency that is a difference between the reference frequency $HF_{rf}(t)$ and the frequency offset HF-1. During the time period between the times t1 and t2 of the cycle 1 of the RF signal 130A, the RF power supply 120B supplies the second portion of the RF signal 134 having a frequency that is a difference between the reference frequency $HF_{rf}(t)$ and the frequency offset HF-2 and during a time period between the times t6 and t7 of the cycle 1 of the RF signal 130A, the RF power supply 120B supplies a portion of the RF signal 134 having a frequency that is a sum of the reference frequency $HF_{rf}(t)$ and the frequency offset HF1. Also, during the time period between the times t0 and t1 of the cycle 2 of the RF signal 130A, the RF power supply 120B supplies a first portion of the RF signal 134 having the frequency offset HF-1 and during the time period between the times t1 and t2 of the cycle 2, the RF power supply 120B supplies a second portion of the RF signal 134 having the frequency offset HF-2. For each cycle of the RF signal 130A, the second portion is consecutive to the first portion of the RF signal 134. It should be noted that the RF signal 134 is a continuous wave signal. The RF signal 134 is sent from the RF power supply 120B via the output O2 and the input I2 to the IMC 104.

The IMC 104 receives the RF signals 130A and 134 and combines the RF signals 130A and 134 while simultaneously matching an impedance of the load with the source to output a modified RF signal 402 at the output O3. The modified RF signal 402 is sent from the IMC 104 via the output O3 to the chuck 108 for processing the substrate S. When one or more process gases, such as an oxygen containing gas or a fluorine containing gas, are supplied to the plasma chamber 106 in addition to supplying power of the modified RF signal 402 to the lower electrode of the chuck 108, plasma is stricken or maintained within the plasma chamber 106 to process the substrate S. When the frequency offsets stored within the table 1 are used to process the substrate S, an amount of power reflected towards the HF RFG is reduced and an amount of power delivered to the plasma chamber 106 is increased to increase a rate of processing the substrate. When the amount of power reflected towards the HF RFG is reduced and the amount of power delivered to the plasma chamber 106 is increased, a delivered power to reflected power ratio increases. The delivered power to reflected power ratio is a ratio of power delivered at the output O2 and power reflected at the output O2. The amount of power delivered to the plasma chamber 106 increases when an amount of power delivered at the output O2 of the HF RFG increases.

In one embodiment, during processing of the substrate S, an RF signal generated by the RF power supply 120B is a multistate signal instead of the continuous wave RF signal 134. During each cycle of operation of the LF RFG, the multistate RF signal provided at the output O2 by the HF RFG periodically transitions from one power level of the first state to a different power level of the second state.

Figure 5A:
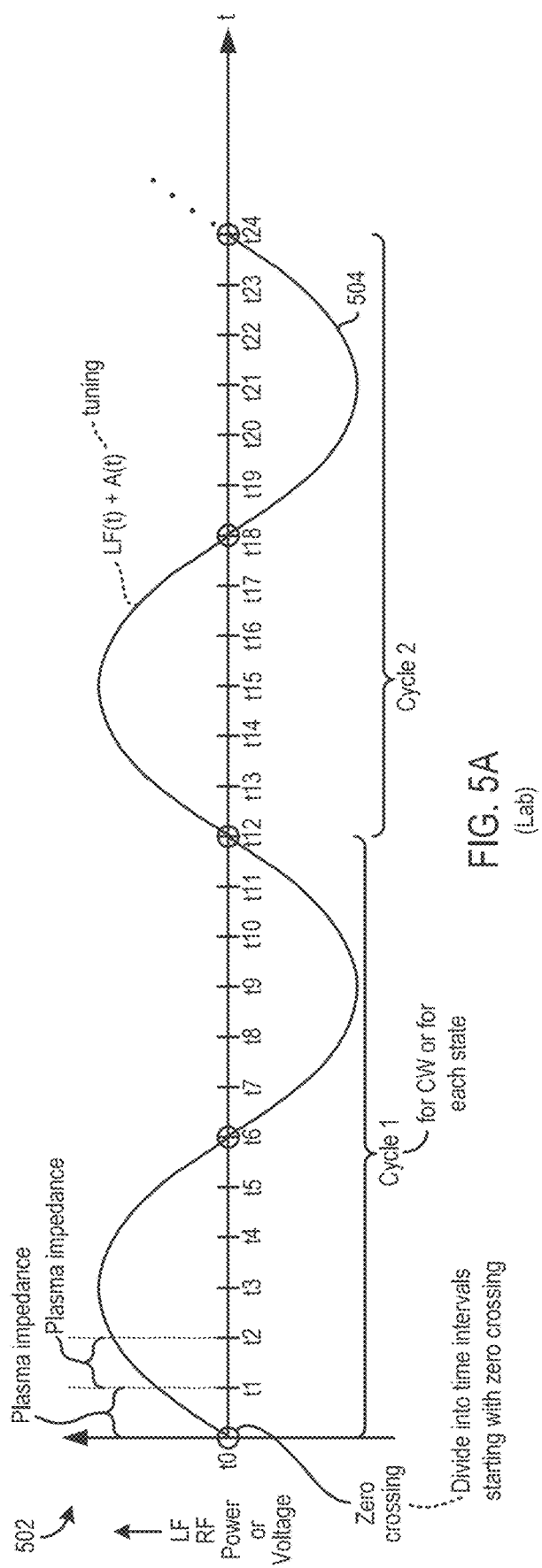
FIG. 5A is an embodiment of a graph to illustrate a voltage signal, which represents voltage amounts of an RF signal generated by a low frequency (LF) RFG.

FIG. 5A is an embodiment of a graph 502 to illustrate a voltage signal 504, which represents voltage amounts of an RF signal generated by the LF RFG of FIG. 1. The graph 502 plots the voltage amounts of the RF signal generated by the LF RFG versus the time t. The voltage signal 504 is generated by the processor 110 of FIG. 1 from measurements of a voltage at the output O3 of FIG. 1. The voltage signal 504 has a different frequency LF(t)+A(t) compared to the frequency LF(t) of the voltage signal 204 of FIG. 2A, where A(t) is a positive real number or a negative real number and is a function of the time t and varies with the time t. Also, LF(t) is a function of the time t and varies with the time t. The frequency LF(t) is sometimes referred to herein as a specific frequency of the LF RFG and the amount A(t) is a change in the specific frequency LF(t). The frequency LF(t)+A(t) is of operation of the LF RFG. The change in frequency of the voltage signal 504 represents that a frequency of the LF RFG is tuned during processing of the substrate S. For example, during the cycle 1 of operation of the LF RFG, the frequency LF(t) is tuned to LF(t)+A(t). Accordingly, the frequency offsets of an RF signal to be generated by the HF RFG are determined for the changed frequency LF(t)+A(t) instead of for the frequency LF(t). The voltage signal 504 is divided into multiple time intervals by the processor 110 of FIG. 1 in the same manner for each cycle of the voltage signal in which the voltage signal 204 is divided into the time intervals from the time t0 to the time t12.

Figure 5B:
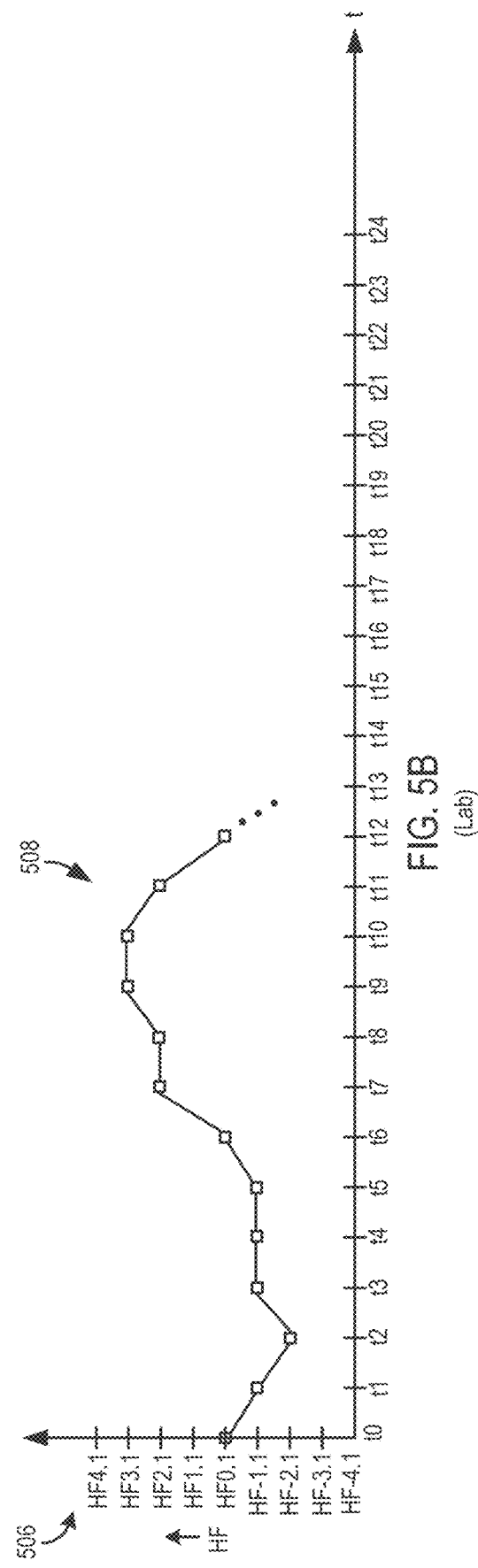
FIG. 5B is an embodiment of a graph to illustrate a determination of frequency offsets corresponding to the voltage signal of FIG. 5A.

FIG. 5B is an embodiment of a graph 506 to illustrate use of the empirical method to facilitate a determination of frequency offsets corresponding to the voltage signal 504 of FIG. 5A. The frequency offsets are determined by the processor 110 of FIG. 1. The frequency offsets illustrated in the graph 506 are represented as a frequency signal 508 and are offsets with respect to a reference frequency HF0.1. The reference frequency HF0.1 is an example of the reference frequency $HF_{rf}(t)$. By determining the frequency offsets of the HF RF generator, the processor 110 provides the frequency signal 508. The frequency signal 508 is sometimes referred to herein as a changed frequency adjusting waveform. The graph 506 plots the frequency offsets of the frequency signal 508 versus the time t for the cycle 1 of the voltage signal 504. For example, during a time interval between the times t0 and t1, the frequency offset HF-1.1 of an RF signal to be generated by the RF power supply 120B of FIG. 1 is determined by the processor 110 and during a time interval between the times t1 and t2, the frequency offset HF-2.1 of the RF signal to be generated by the RF power supply 120B is determined by the processor 110.

It should be noted that the frequency offsets of the frequency signal 508 are of a continuous wave RF signal that is to be generated by the RF power supply 120B of FIG. 1. Moreover, the RF signal that is generated by the RF power supply 120A and whose voltage values are represented by the voltage signal 504 is also a continuous wave signal.

In one embodiment, the frequency offsets of the frequency signal 508 are frequencies associated with a power level of a first state of a multistate RF signal that is to be generated by the RF power supply 120B. Moreover, in the same manner in which the frequency offsets, of the frequency signal 508, associated with the power level of the first state are determined, frequency offsets associated with a power level of a second state of the multistate RF signal to be generated by the RF power supply 120B are determined by the processor 110. The first and second states occur during the cycle 1 of voltage signal 504.

It should be noted that in an embodiment, each frequency offset of an HF signal, described herein, generated by the HF RFG is a change in frequency of the HF RFG with respect to the reference frequency $HF_{rf}(t)$ of the HF signal. For example, each frequency offset HF3, HF2, HF1, HF-1, HF-2, and HF-3 of the frequency signal 208 of FIG. 2B is a change with respect to the reference frequency HF0 and each frequency offset HF3.1, HF2.1, HF1.1, HF-1.1, HF-2.1, and HF-3.1 of the frequency signal 508 of FIG. 5B is a change with respect to the reference frequency HF0.1.

Figure 6:
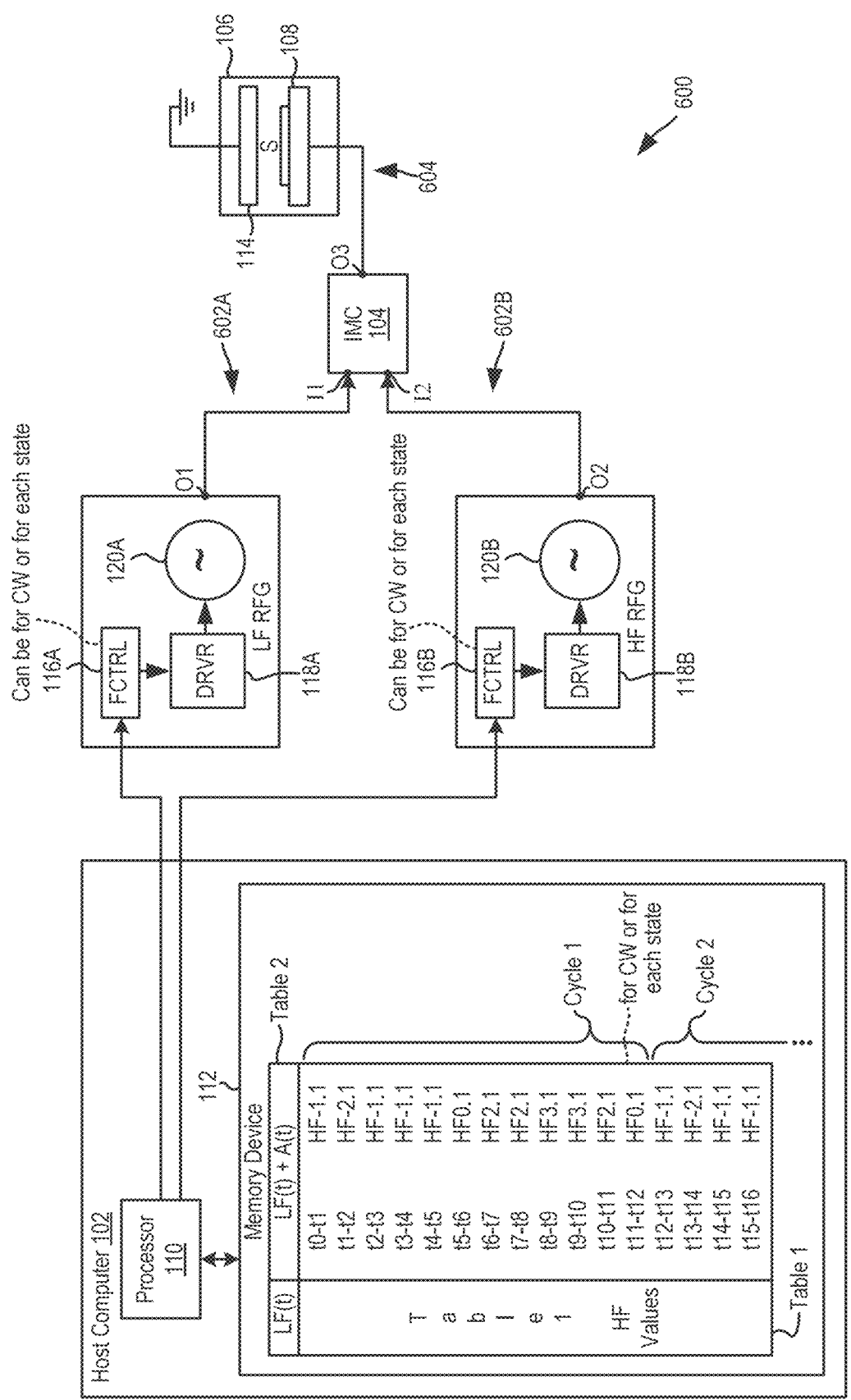
FIG. 6 is a block diagram of an embodiment of a system to illustrate use of multiple tables when a frequency of the LF RFG is being tuned during processing of the substrate.

FIG. 6 is a block diagram of an embodiment of a system 600 to illustrate use of multiple tables including the table 1 and a table 2 when a frequency of the LF RFG is being tuned to process the substrate S. The table 2 is another example of another database stored within the memory device 112. The frequency offsets of the frequency signal 508 are stored in the table 2. The processor 110 stores within the table 2 the frequency offsets, corresponding to the voltage signal 504 of FIG. 5, for the time periods between the times t0 and t12. The frequency offsets stored within the table 2 are of the RF power supply 120B and are illustrated in FIG. 5B. It should be noted when the HF RFG operates according to the frequency offsets illustrated in the table 2, the frequency signal 508 is optimized for the frequency LF(t)+A(t) of the LF RFG.

The processor 110 controls the RF power supply 120A via the frequency controller 116A and the driver 118A to generate an RF signal 602A having the frequency LF. For example, during the time period between the times t0 and t1, the processor 110 selects a process operation, which is defined by a recipe, such as the frequency LF(t), and provides the frequency LF(t) to the frequency controller 116A of the LF RFG. The RF power supply 120A supplies the RF signal 602A via the output O1 and the input I1 to the IMC 104. During the time period between the times t1 and t2, the processor 110 tunes the frequency LF of the RF signal 602A to change the frequency LF(t) to LF(t)+A(t) during processing of the substrate S. For example, the processor 110 provides the frequency LF(t)+A(t) to the frequency controller 116A. The processor 110 selects another process operation, which is defined by another recipe, such as the frequency LF(t)+A(t), and provides the frequency LF(t)+A(t) to the frequency controller 116A of the LF RFG. The frequency controller 116A controls the RF power supply 120A via the driver 118A to modify the frequency LF(t) of the RF signal 602A from LF(t) to LF(t)+A(t). The tuning of the frequency LF(t) to the frequency LF(t)+A(t) may be done to change a process operation, such as to increase or decrease a rate of processing the substrate S or to control processing of the substrate S or to deposit a material on the substrate S instead of etching the substrate S or to etch the substrate S instead of depositing the material on the substrate S or to clean the substrate S instead of depositing the material on the substrate S.

During the time interval between the times t0 and t1, the frequency of the RF signal 602A is controlled or set by the processor 110 to be LF(t). Moreover, during the time interval between the times t0 and t1, the processor 110 accesses the table 1 to access the frequency offsets stored in the table 1 and controls or sets a frequency of an RF signal 602B to be generated by the RF power supply 120B to be HF-1, which is stored within the table 1. The frequency offsets stored in the table 1 are applied by the processor 110 by providing the frequency offsets to the frequency controller 116B of the HF RFG to further control the RF power supply 120B to operate at the frequency offsets. Upon changing, during the time interval between the times t1 and t2, the frequency of the RF signal 602A from LF(t) to LF(t)+A(t), the processor 110 accesses the frequency offsets stored in the table 2 and controls the frequency of the RF signal 602B to be HF-2.1 of the table 2 instead of HF-2 of the table 1. The frequency offsets, stored in the table 2, of the frequency signal 508 correspond to the frequency LF(t)+A(t) and are applied when the LF RFG operates at the frequency LF(t)+A(t). When the frequency of the RF signal 602B is controlled to be HF-2.1 of the table 2, the processor 110 selects the frequency offsets of the frequency signal 508 of FIG. 5B. The frequency offsets stored in the table 2 are applied by the processor 110 by providing the frequency offsets to the frequency controller 116B of the HF RFG to further control the RF power supply 120B to operate at the frequency offsets.

The processor 110 provides the frequency offsets for each of the remaining time intervals between the times t2 and t12 of the cycle 1 of operation of the LF RFG to the frequency controller 116B. Upon receiving the frequency offsets, the frequency controller 116B controls the RF power supply 120B via the driver 118B to generate the RF signal 602B. The RF power supply 120B supplies the RF signal 602B via the output O2 and the input I2 to the IMC 104.

The IMC 104 receives the RF signals 602A and 602B and combines the RF signal 602A and 602B while matching an impedance of the load with the source to output a modified RF signal 604 at the output O3. The IMC 104 supplies the modified RF signal 604 to the chuck 108. When the one or more process gases and the modified RF signal 604 are supplied to the plasma chamber 106, plasma is generated or maintained within the plasma chamber 106 for processing the substrate S.

Figure 7A:
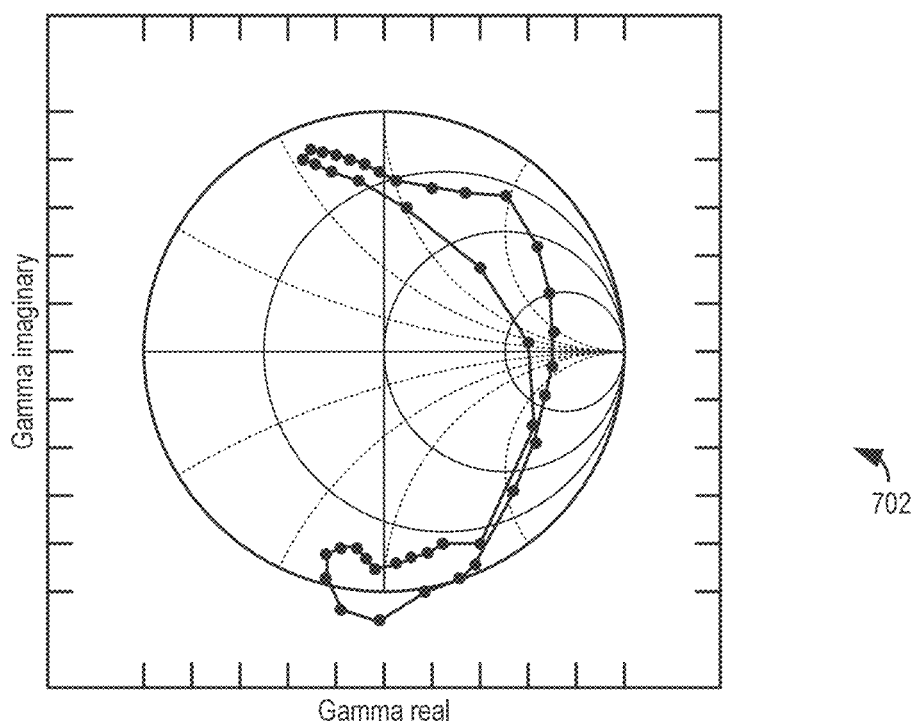
FIG. 7A is an embodiment of a Smith chart to illustrate a plot of a magnitude of a reflection coefficient gamma when the method for optimizing power to be delivered to the plasma chamber is not applied.

FIG. 7A is an embodiment of a Smith chart 702 to illustrate a plot of a parameter gamma, which is a reflection coefficient. The Smith chart 702 plots a real part of gamma versus an imaginary part of gamma. The parameter gamma represents power that is reflected towards the HF RFG from the plasma chamber 106 of FIG. 1. For example, a gamma value of zero represents that a minimal or zero amount of power is reflected towards the HF RFG and a gamma value of one represents that a maximum amount of power is reflected towards the HF RFG.

The Smith chart 702 is plotted when the method for optimizing power to be delivered to the plasma chamber 106 of FIG. 1 is not applied. As shown in the Smith chart 702, for one cycle, such as the cycle 1 of FIG. 2A or FIG. 5A, of operation of the LF RFG of FIG. 1, the parameter gamma does not pass through a center of the Smith chart 702. There are wide variations on the Smith chart 702 through one cycle, such as the cycle 1 (FIG. 2A), of the LF RFG. As such, a high amount of power is reflected towards the HF RFG from the plasma chamber 106 and a low amount of power is delivered to the plasma chamber 106 from the HF RFG.

Figure 7B:
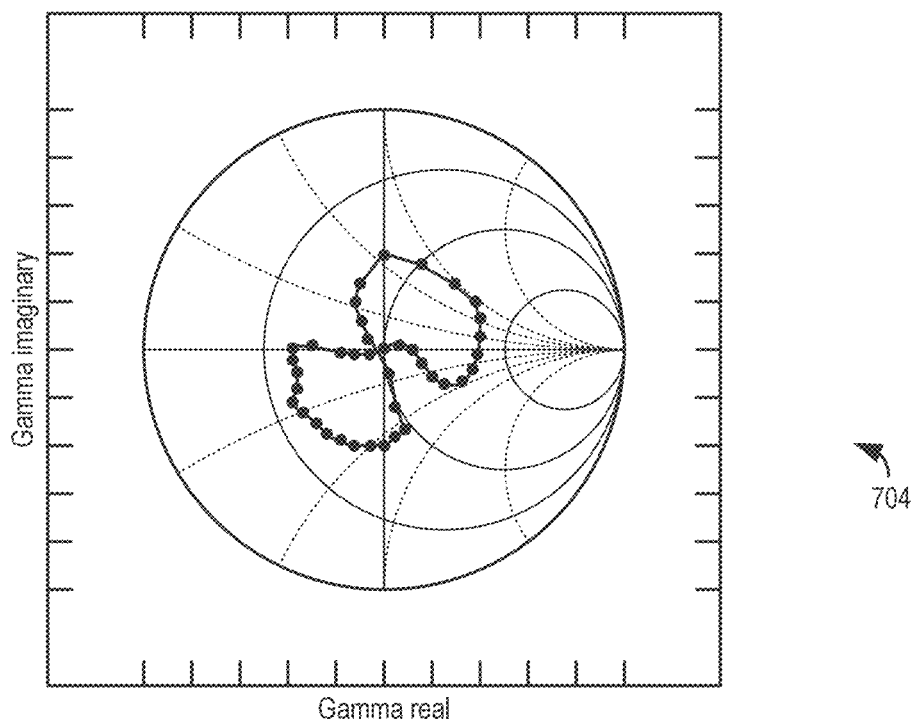
FIG. 7B is an embodiment of another Smith chart to illustrate a plot of a magnitude of the reflection coefficient gamma when the method for optimizing power to be delivered to the plasma chamber is applied.

FIG. 7B is an embodiment of the Smith chart 704 to illustrate a plot of the parameter gamma when the method for optimizing power to be delivered to the plasma chamber 106 of FIG. 1 is applied. The Smith chart 704 plots imaginary values of the parameter gamma versus real values of the parameter gamma As shown in the Smith chart 704, the parameter gamma passes through a center of the Smith chart 704 twice during a cycle, such as the cycle 1 of FIG. 2A or FIG. 5A, of operation of the LF RFG. Accordingly, a low amount of power is reflected towards the HF RFG from the plasma chamber 106 and a high amount of power is delivered to the plasma chamber 106 from the HF RFG.

Figure 8A:
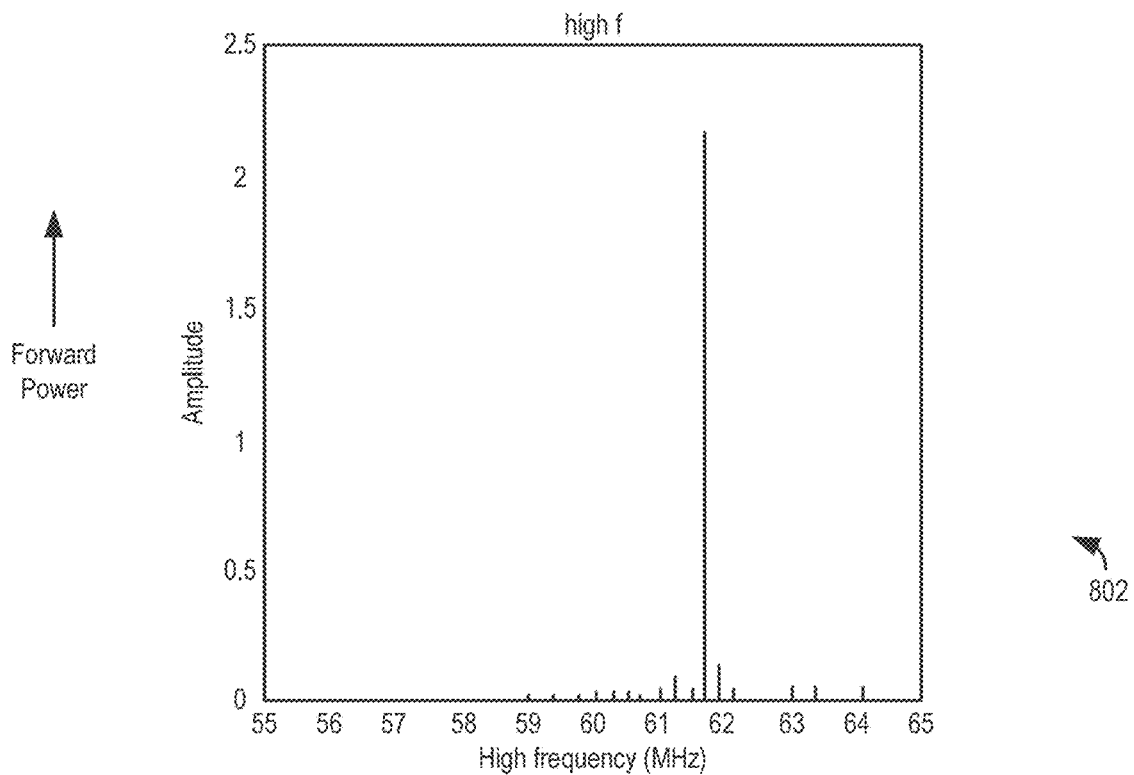
FIG. 8A is an embodiment of a graph to illustrate that forward power or forward amplitude is focused at a frequency of operation of the HF RFG when the method for optimizing power to be delivered to the plasma chamber is not applied.

FIG. 8A is an embodiment of a graph 802 to illustrate that forward power is focused at a frequency of operation of the HF RFG of FIG. 1. The graph 802 is generated by applying a Fast Fourier transform analysis to forward power of the HF RFG and the forward power is measured using the directional coupler 124 and the oscilloscope 126 illustrated in FIG. 1. The graph 802 plots values of the forward power versus frequency values of the HF RFG. The forward power illustrated in the graph 802 is power supplied by the HF RFG that is operated at one frequency value during a cycle, such as the cycle 1 of FIG. 2A or FIG. 5A, of operation of the LF RFG. The graph 802 is plotted when the method for optimizing power to be delivered to the plasma chamber 106 of FIG. 1 is not applied. As illustrated in FIG. 8A, a frequency value of the HF RFG remains unchanged through the cycle 1 of operation of the LF RFG.

Figure 8B:
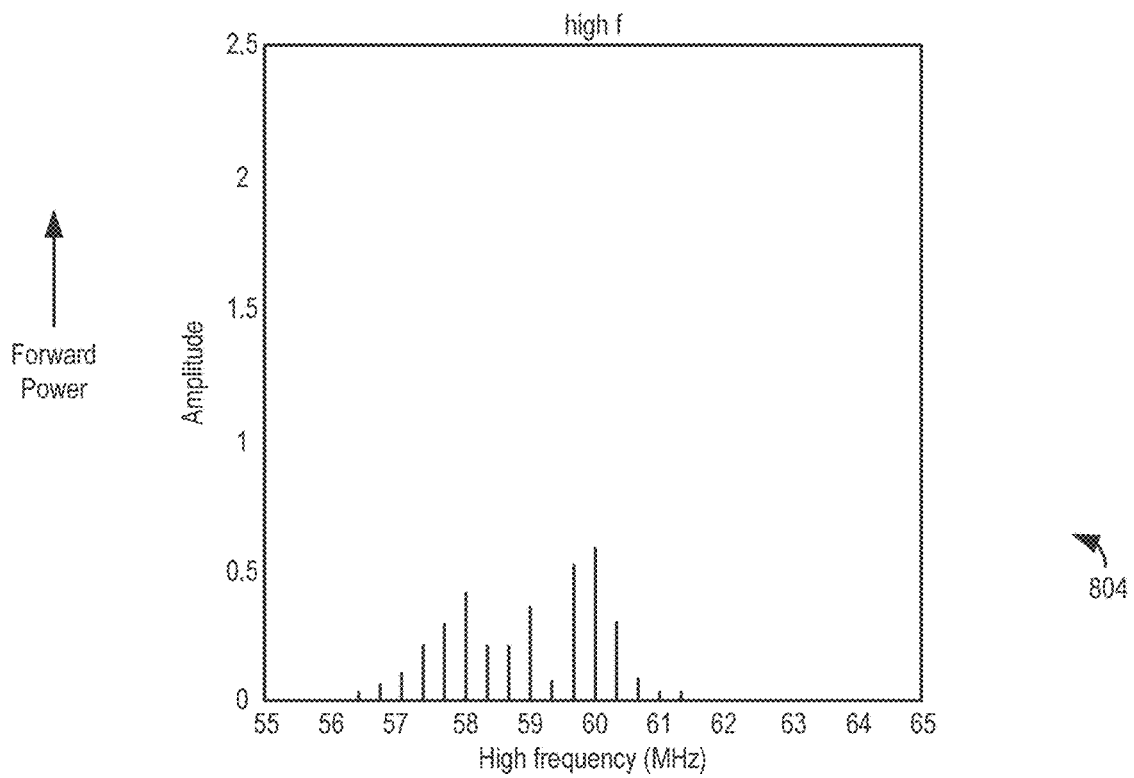
FIG. 8B is an embodiment of a graph to illustrate that forward power or forward amplitude is distributed over multiple frequencies of operation of the HF RFG when the method for optimizing power to be delivered to the plasma chamber is applied.

FIG. 8B is an embodiment of a graph 804 to illustrate that forward power is distributed over multiple frequencies of operation of the HF RFG of FIG. 1. The graph 804 is plotted when the method for optimizing power to be delivered to the plasma chamber 106 of FIG. 1 is applied. The graph 804 plots amounts of the forward power supplied by the HF RFG versus frequency values of the HF RFG. The frequency values illustrated in the graph 804 are examples of the frequency values of the frequency signal 208 of FIG. 2B.

Figure 9A:
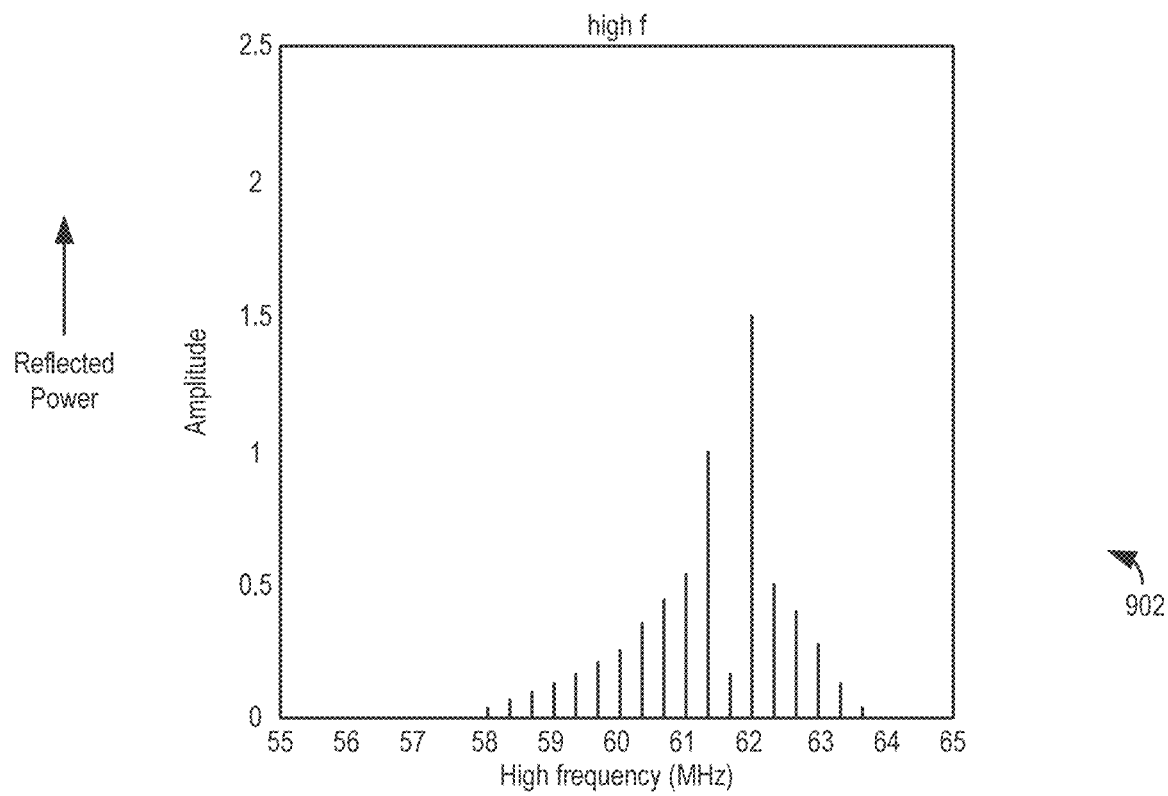
FIG. 9A is an embodiment of a graph to illustrate an amplitude of power reflected towards the HF RFG when the method for optimizing power to be delivered to the plasma chamber 106 of FIG. 1 is not applied.

FIG. 9A is an embodiment of a graph 902 to illustrate power reflected towards the HF RFG of FIG. 1 from the plasma chamber 106 of FIG. 1 when the method for optimizing power to be delivered to the plasma chamber 106 is not applied. The graph 902 is generated by applying a Fast Fourier transform analysis to reflected power of the HF RFG and the reflected power is measured using the directional coupler 124 and the oscilloscope 126 illustrated in FIG. 1. The graph 902 plots values of the reflected power versus frequency values of the HF RFG.

Figure 9B:
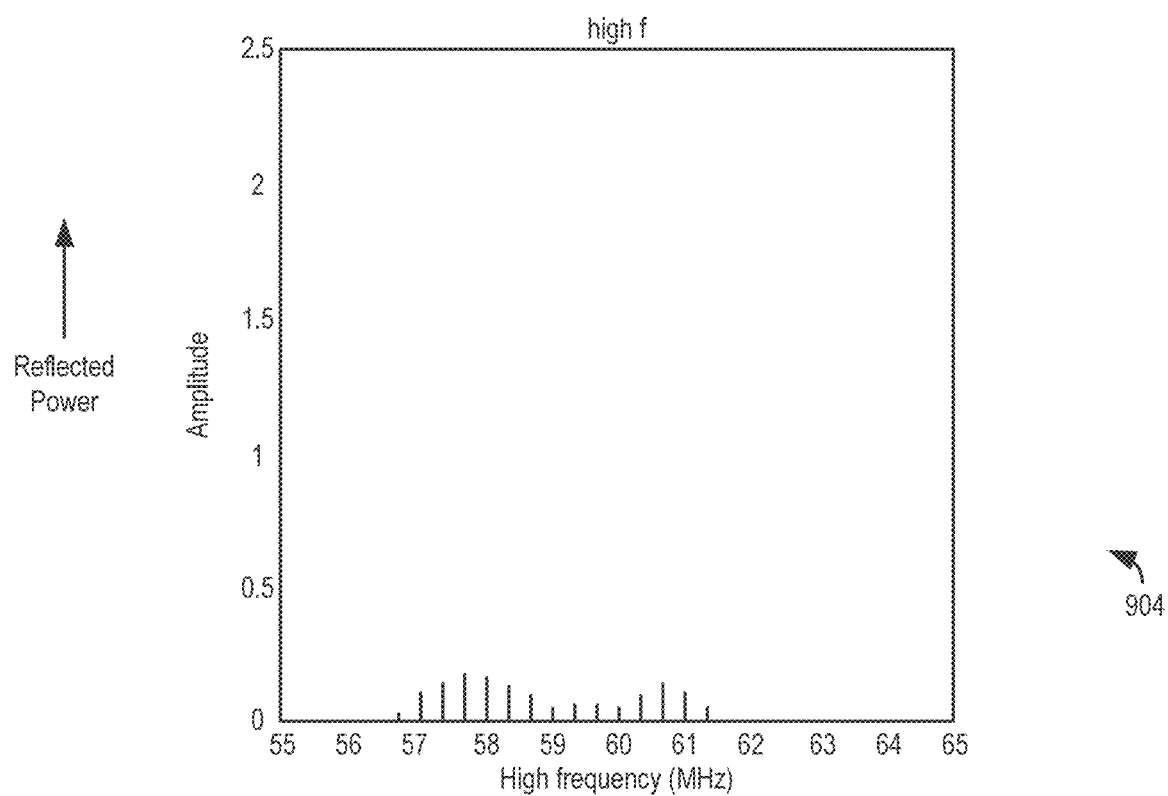
FIG. 9B is an embodiment of a graph to illustrate an amplitude of power reflected towards the HF RFG when the method for optimizing power to be delivered to the plasma chamber is applied.

FIG. 9B is an embodiment of a graph 904 to illustrate power that is reflected towards the HF RFG of FIG. 1 from the plasma chamber 106 of FIG. 1 when the method for optimizing power to be delivered to the plasma chamber 106 is applied. The graph 904 plots values of the reflected power verses frequency values of the HF RFG. As illustrated by the graphs 902 and 904, power reflected towards the HF RFG is less or minimal when the method is applied compared to when the method is not applied. When the method for optimizing power is not applied, a high amount of power is reflected at a frequency of the HF RFG as modulated by frequencies of the LF RFG to decrease efficiency of power delivered by the HF RFG.

Figure 10A:
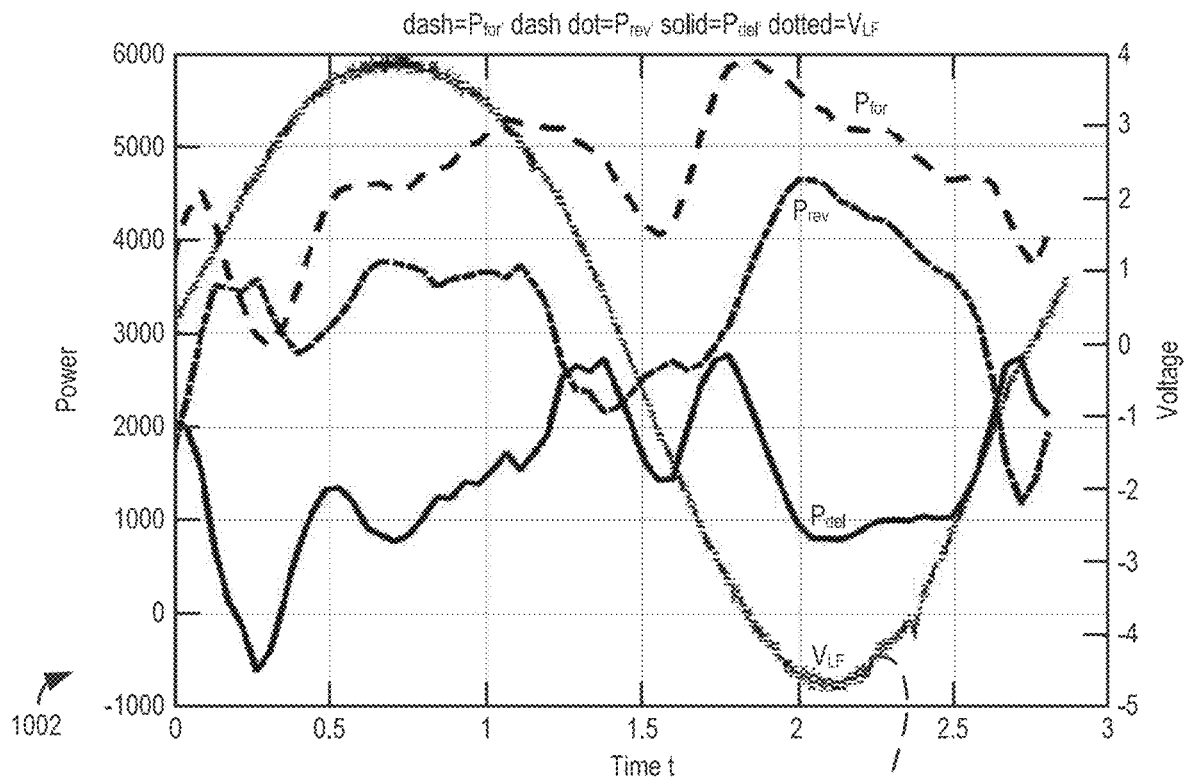
FIG. 10A is an embodiment of a graph to illustrate instantaneous forward power supplied by the HF RFG, instantaneous power reflected towards the HF RFG, and instantaneous power delivered by the HF RFG during a cycle of operation of the LF RFG when the method for optimizing power to be delivered to the plasma chamber is not applied.

FIG. 10A is an embodiment of a graph 1002 to illustrate instantaneous forward power supplied by the HF RFG of FIG. 1, instantaneous power reflected towards the HF RFG from the plasma chamber 106 of FIG. 1, and instantaneous power delivered by the HF RFG during a cycle of operation of the LF RFG of FIG. 1. The graph 1002 plots power associated with the HF RFG versus the time t. The graph 1002 includes a plot of the forward power $P_{for}$, a plot of the reflected power $P_{rev}$, a plot of the delivered power $P_{del}$, and voltage values $V_{LF}$ during the cycle of operation of the LF RFG. The graph 1002 is plotted when the method for optimizing power to be delivered to the plasma chamber 106 of FIG. 1 is not applied.

Figure 10B:
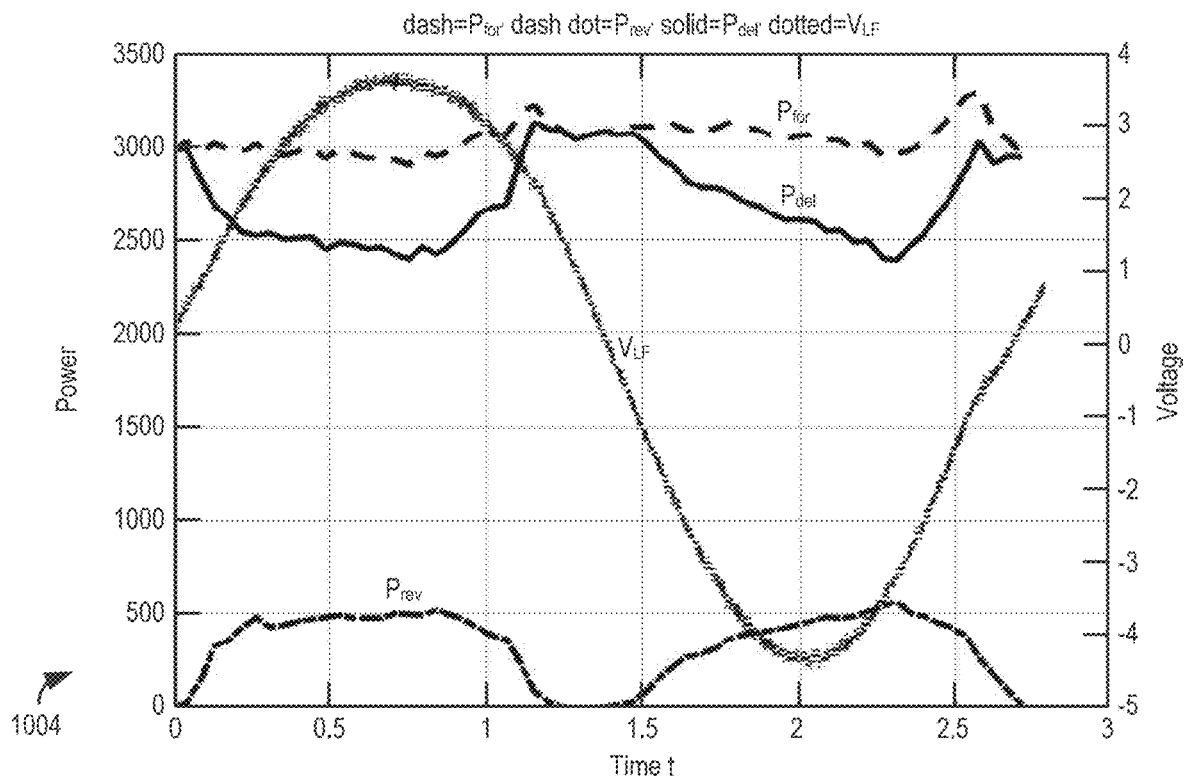
FIG. 10B is an embodiment of a graph to illustrate instantaneous forward power supplied by the HF RFG, instantaneous power reflected towards the HF RFG, and instantaneous power delivered by the HF RFG during a cycle of operation of the LF RFG when the method for optimizing power to be delivered to the plasma chamber is applied.

FIG. 10B is an embodiment of a graph 1004 to illustrate instantaneous forward power supplied by the HF RFG of FIG. 1, instantaneous power reflected towards the HF RFG from the plasma chamber 106 of FIG. 1, and instantaneous power delivered by the HF RFG during a cycle of operation of the LF RFG of FIG. 1. The graph 1004 plots power associated with the HF RFG versus the time t. The graph 1004 includes a plot of the forward power $P_{for}$, a plot of the reflected power $P_{rev}$, and the voltage values $V_{LF}$ during the cycle, such as the cycle 1 of FIG. 2A or 5A, of operation of the LF RFG. The graph 1002 is plotted when the method for optimizing power to be delivered to the plasma chamber 106 of FIG. 1 is applied. As illustrated in the graphs 1004 and 1002 of FIG. 10A, the reflected power is much lower when the method is applied compared to when the method is not applied.

Figure 11:
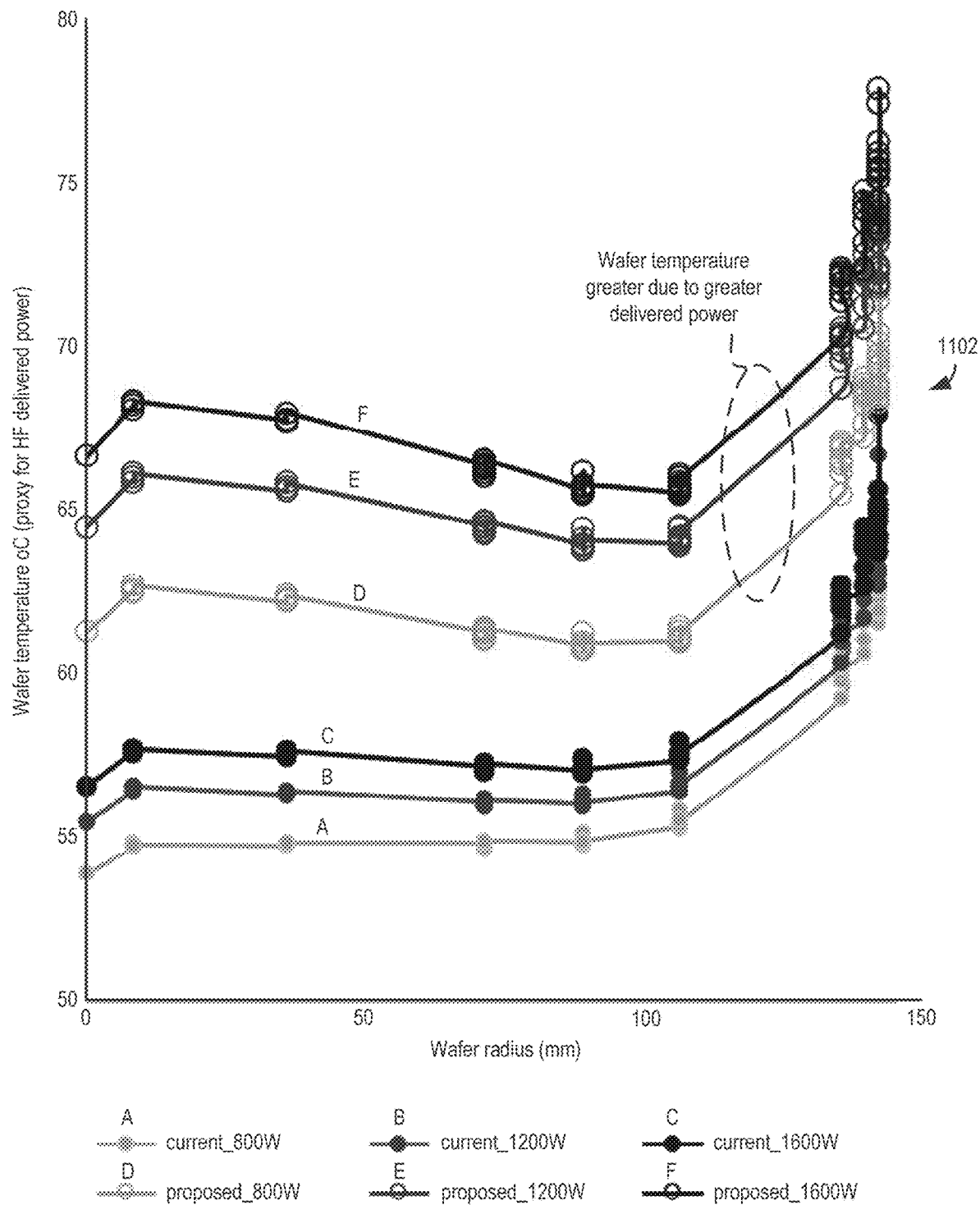
FIG. 11 is an embodiment of a graph that plots a temperature of the substrate versus a radius of the substrate.

FIG. 11 is an embodiment of a graph 1102 that plots the temperature of the substrate S versus a radius of the substrate S. The graph 1102 includes multiple plots labeled A through F. The plots A through C correspond to different power levels, e.g., 800 watts (W), 1200 watts, and 1600 watts, of RF signals supplied by the HF RFG of FIG. 1 when the method for optimizing power to be delivered to the plasma chamber 106 of FIG. 1 is not applied. Moreover the plots D through F correspond to the different power levels of RF signals supplied by the HF RFG when the method for optimizing power to be delivered to the plasma chamber 106 of FIG. 1 is applied. As illustrated by the plots labeled A through F, a temperature of the substrate S is greater when the method is applied compared to when the method is not applied. The increase in temperature is a result of a greater amount of power delivered to the plasma chamber 106 by application of the method.

Figure 12A:
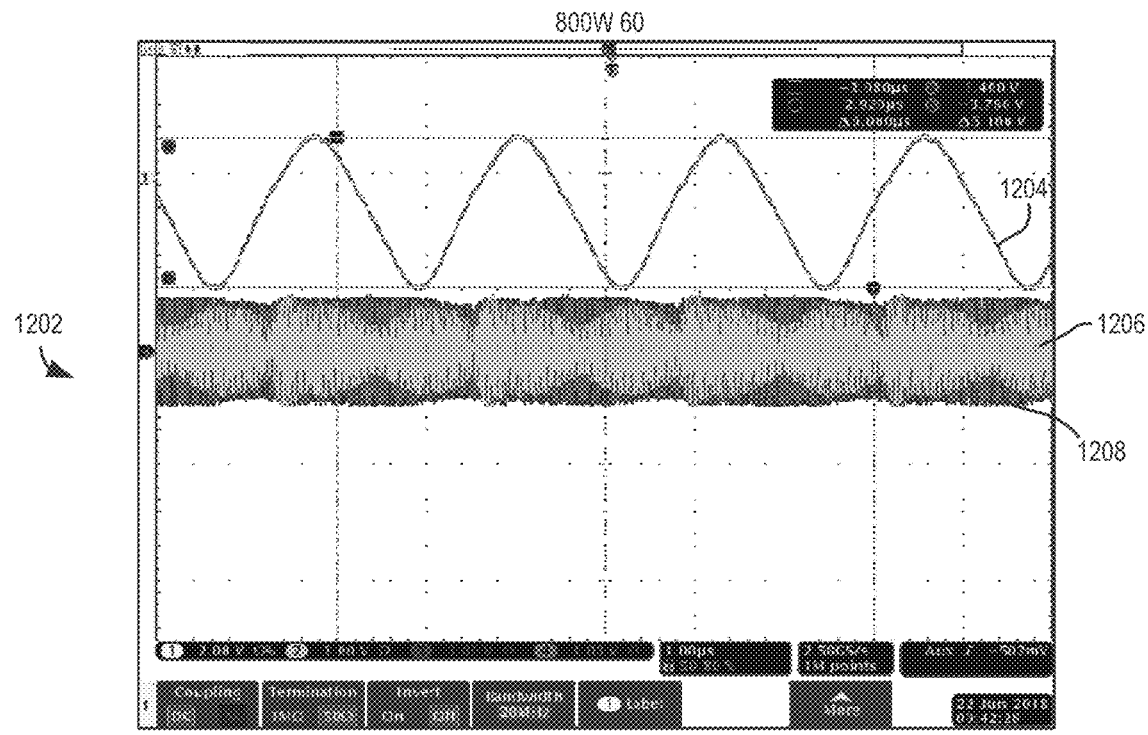
FIG. 12A is an embodiment of a graph to illustrate an amount of power or wave reflected towards the HF RFG when the method for optimizing power to be delivered to the plasma chamber is not applied.

FIG. 12A is an embodiment of a graph 1202 to illustrate an amount of power reflected towards the HF RFG when the method for optimizing power to be delivered to the plasma chamber 106 of FIG. 1 is not applied. The graph 1202 includes a plot 1204 of a voltage of an RF signal generated by the LF RFG of FIG. 1 versus the time t. In addition, the graph 1202 includes a plot 1206 of power that is supplied by the HF RFG and a plot 1208 of power reflected towards the HF RFG. The graph 1202 is plotted when the HF RFG is controlled to supply 800 watts of power.

Figure 12B:
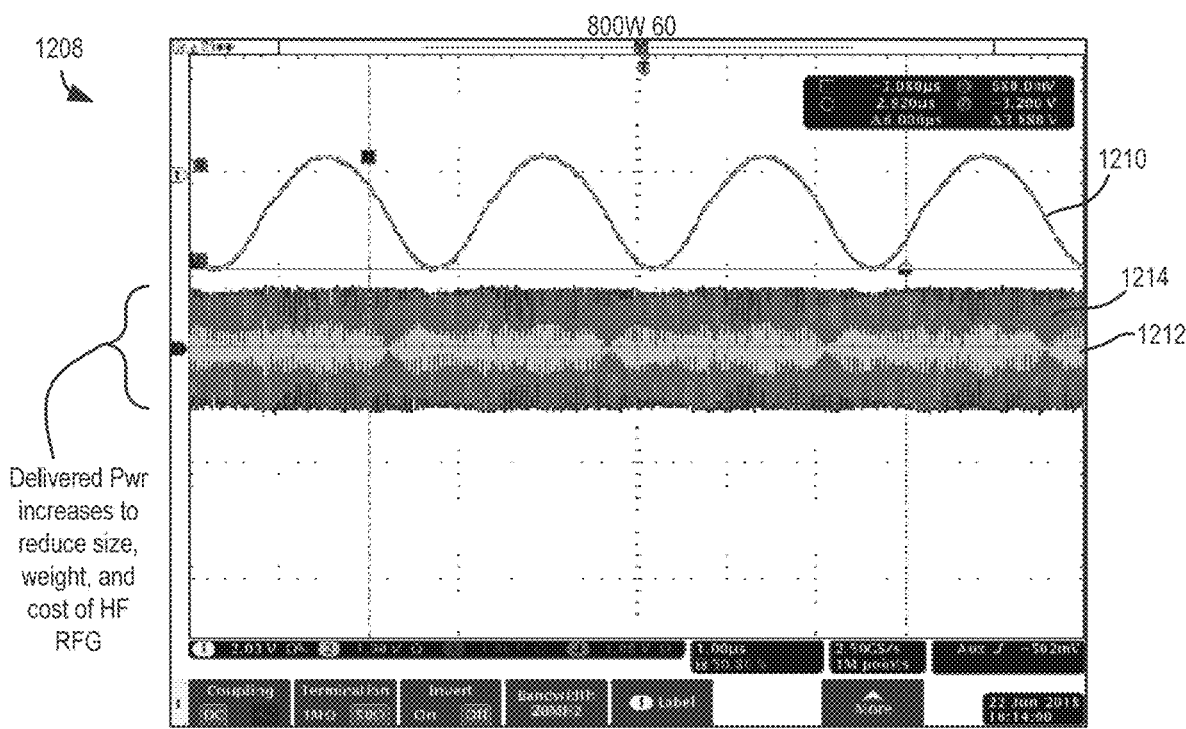
FIG. 12B is an embodiment of a graph to illustrate an amount of power or wave reflected towards the HF RFG when the method for optimizing power to be delivered to the plasma chamber is applied.

FIG. 12B is an embodiment of a graph 1208 to illustrate an amount of power reflected towards the HF RFG when the method for optimizing power to be delivered to the plasma chamber 106 of FIG. 1 is applied. The graph 1208 includes a plot 1210 of a voltage of an RF signal generated by the LF RFG of FIG. 1 versus the time t. In addition, the graph 1208 includes a plot 1212 of power that is supplied by the HF RFG and a plot 1214 of power reflected towards the HF RFG. The graph 1208 is plotted when the HF RFG is controlled to supply 800 watts of power. As illustrated by the plots 1206, 1208, 1212, and 1214, power that is delivered by the HF RFG when the method is applied is greater than power delivered by the HF RFG when the method is not applied.

The increase in the delivered power facilitates a reduction in a size, a weight and cost of the HF RFG. For example, when the method is applied, the HF RFG does not need to supply a high amount of power and that reduces the size, the weight, and the cost of the HF RFG.

Figure 13A:
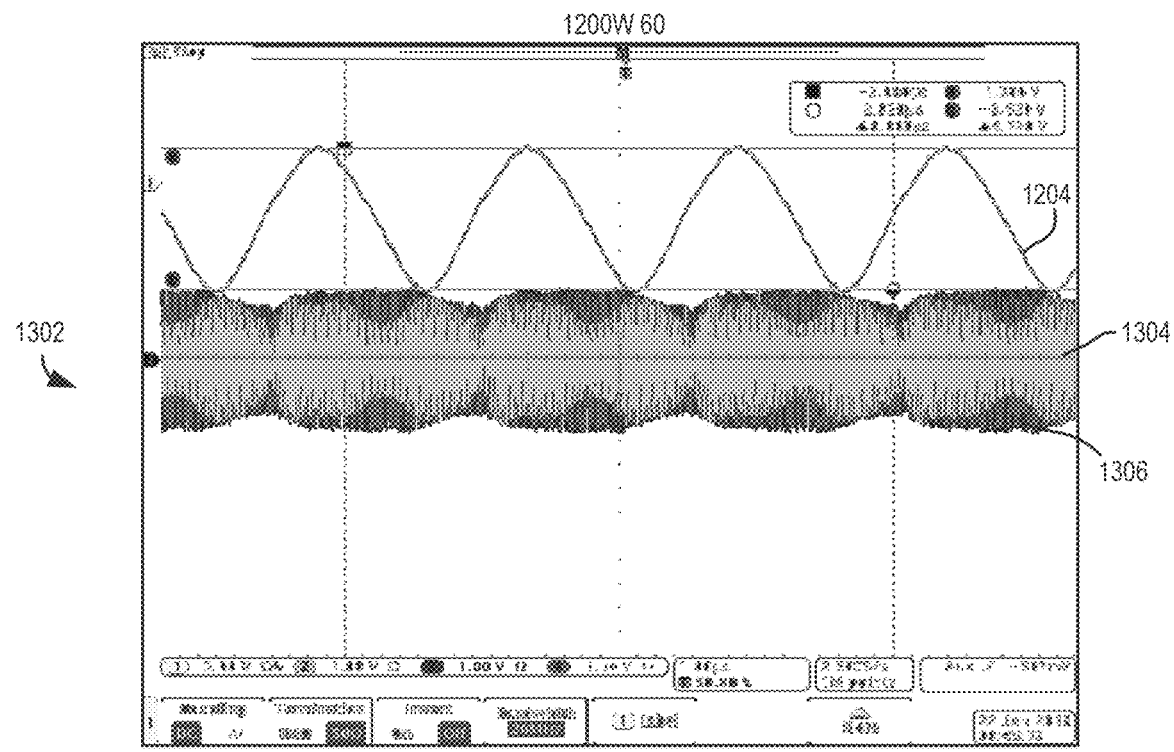
FIG. 13A is an embodiment of a graph to illustrate an amount of power or wave reflected towards the HF RFG when the method for optimizing power to be delivered to the plasma chamber is not applied.

FIG. 13A is an embodiment of a graph 1302 to illustrate an amount of power reflected towards the HF RFG when the method for optimizing power to be delivered to the plasma chamber 106 of FIG. 1 is not applied. The graph 1302 includes a plot 1304 of power that is supplied by the HF RFG versus the time t and a plot 1306 of power reflected towards the HF RFG versus the time t. The HF RFG is controlled to supply 1200 watts of power to generate the graph 1302.

Figure 13B:
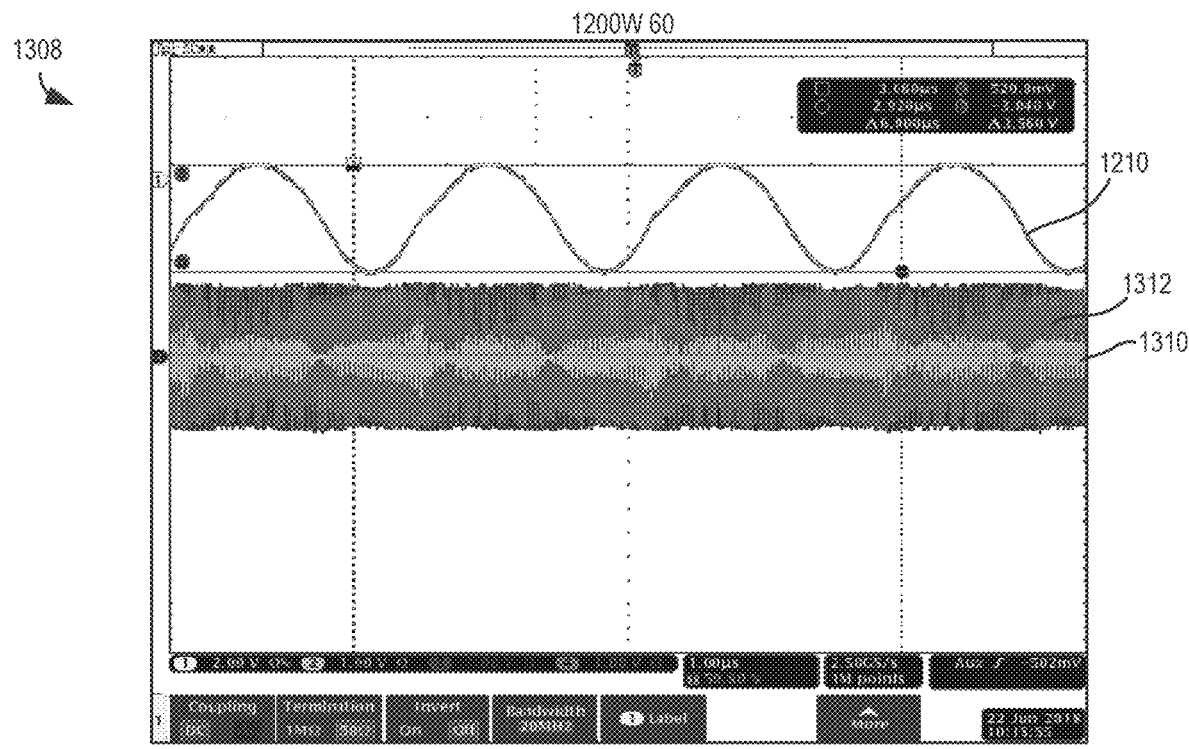
FIG. 13B is an embodiment of a graph to illustrate an amount of power or wave reflected towards the HF RFG when the method for optimizing power to be delivered to the plasma chamber is applied.

FIG. 13B is an embodiment of a graph 1308 to illustrate an amount of power reflected towards the HF RFG when the method for optimizing power to be delivered to the plasma chamber 106 of FIG. 1 is applied. The graph 1308 includes a plot 1310 of power that is supplied by the HF RFG versus the time t and a plot 1312 of power reflected towards the HF RFG versus the time t. The graph 1308 is plotted when the HF RFG is controlled to supply 1200 watts of power. Again, as illustrated by the plots 1304, 1306, 1310, and 1312 of the graph 1308, power that is delivered by the HF RFG when the method is applied is greater than power delivered by the HF RFG when the method is not applied.

Figure 14A:
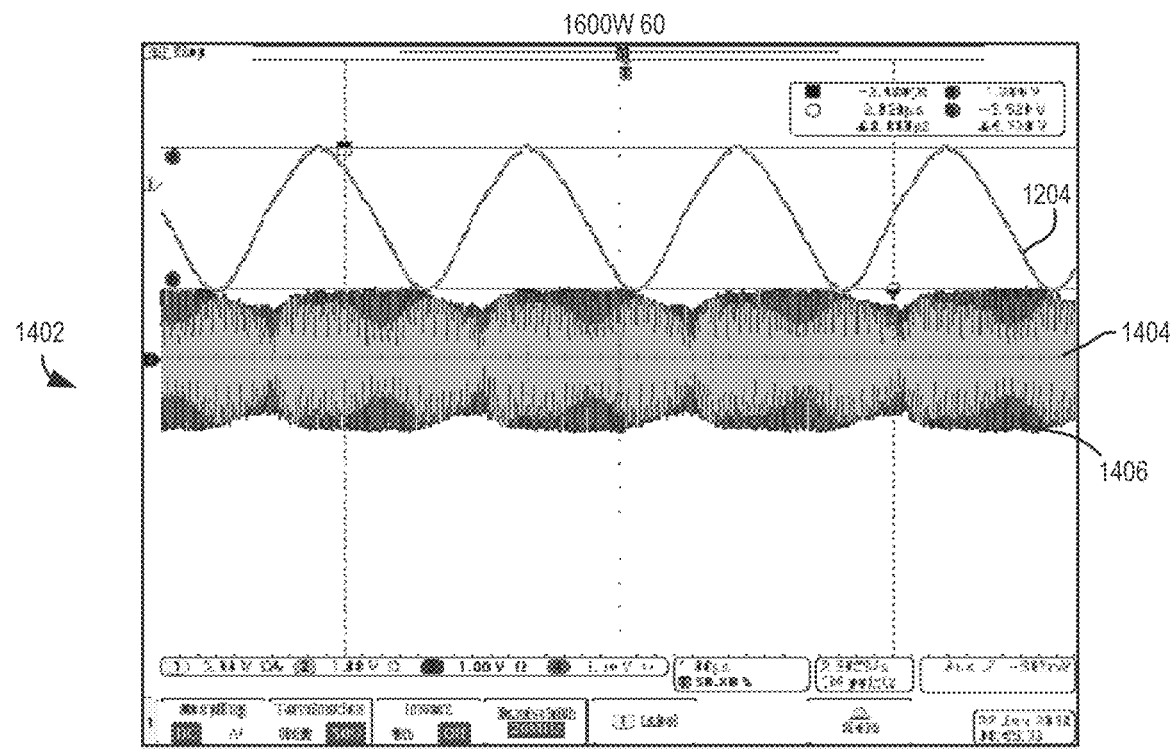
FIG. 14A is an embodiment of a graph to illustrate an amount of power or wave reflected towards the HF RFG when the method for optimizing power to be delivered to the plasma chamber is not applied.

FIG. 14A is an embodiment of a graph 1402 to illustrate an amount of power reflected towards the HF RFG when the method for optimizing power to be delivered to the plasma chamber 106 of FIG. 1 is not applied. The graph 1402 has a plot 1404 of power that is supplied by the HF RFG versus the time t and a plot 1406 of power reflected towards the HF RFG versus the time t. The graph 1402 is plotted when the HF RFG is controlled to supply 1600 watts of power.

Figure 14B:
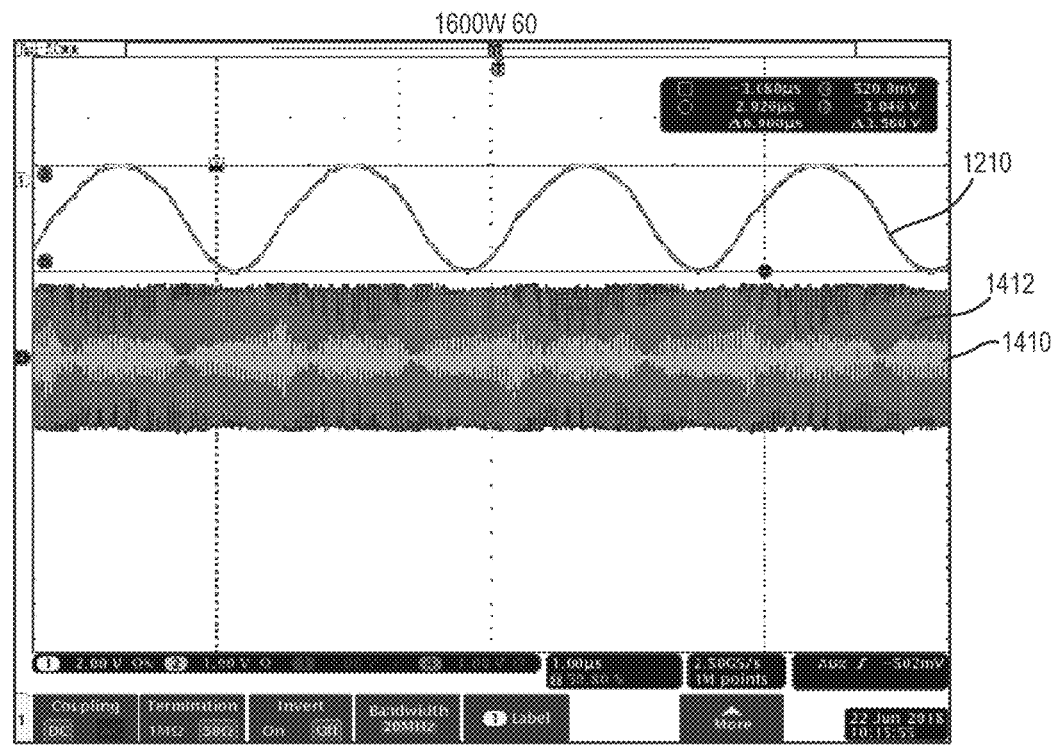
FIG. 14B is an embodiment of a graph to illustrate an amount of power or wave reflected towards the HF RFG when the method for optimizing power to be delivered to the plasma chamber is applied.

FIG. 14B is an embodiment of a graph 1408 to illustrate an amount of power reflected towards the HF RFG when the method for optimizing power to be delivered to the plasma chamber 106 of FIG. 1 is applied. The graph 1408 includes a plot 1410 of power that is supplied by the HF RFG versus the time t and a plot 1412 of power reflected towards the HF RFG versus the time t. The graph 1408 is plotted when the HF RFG is controlled to supply 1600 watts of power. It is illustrated by the plots 1404, 1406, 1410, and 1412 that power that is delivered by the HF RFG when the method is applied is greater than power delivered by the HF RFG when the method is not applied.

Figure 15A:
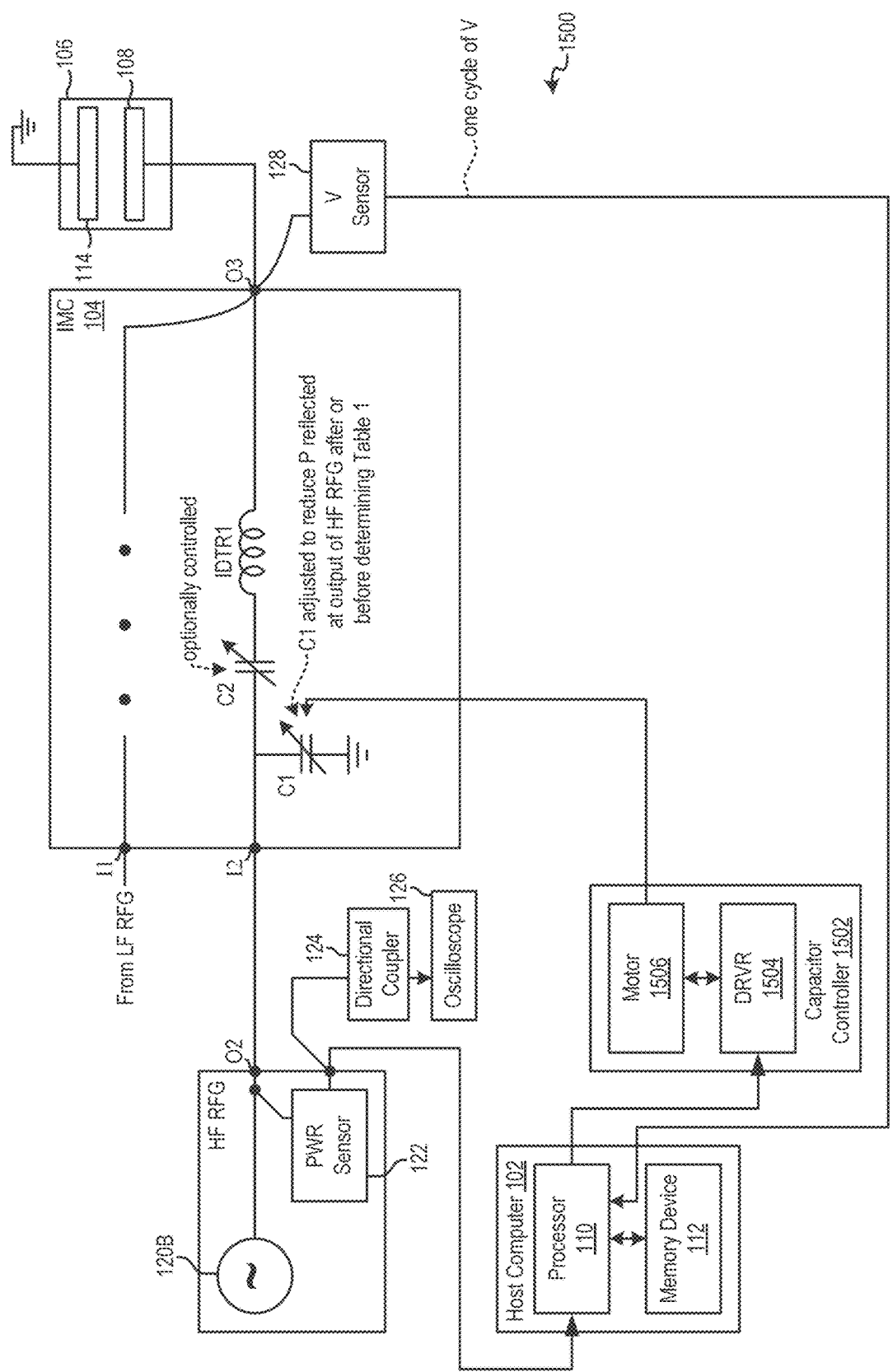
FIG. 15A is a diagram of an embodiment of a system to illustrate use of an impedance matching circuit (IMC) to reduce power reflected towards the HF RFG and to increase power delivered to the plasma chamber.

FIG. 15A is a diagram of an embodiment of a system 1500 to illustrate a determination of capacitance of the IMC 104 to reduce power reflected towards the HF RFG and to increase power delivered to the plasma chamber 106. The capacitance is determined before the substrate S is processed. The system 1500 includes the LF RFG, the HF RFG, the host computer 102, a capacitor controller 1502, the IMC 104, and the plasma chamber 106. The capacitor controller 1502 includes a driver 1504 and an electric motor 1506. The driver 1504 is coupled to the processor 110 and to the electric motor 1506. The electric motor 1506 is coupled to a shunt capacitor C1 of the IMC 104. For example, the electric motor 1506 is coupled via a connection mechanism, such as one or more rods or a combination of one or more rods and one or more gears, to the shunt capacitor C1.

The IMC 104 includes a series capacitor C2 and the shunt capacitor C1. Each of the shunt capacitor C1 and the series capacitor C2 is a variable capacitor. The shunt capacitor C1 is coupled to a ground potential at one end and to the series capacitor C2 and the input I2 at an opposite end. The series capacitor C2 is coupled to the input I2 at one end and to an inductor IDTR1 at an opposite end. The inductor IDTR1 is coupled to the output O3 at one end and to the series capacitor C2 at an opposite end. Similarly, a network of one or more inductors, or one or more capacitors, or a combination of one or more inductors and one or more capacitors is coupled between the input I1 and the output O3.

During operation of the LF RFG, the power sensor 122 provides a measurement of power that is delivered at the output O2 to the processor 110. Before the measurement of power is received, a capacitance of the shunt capacitor C1 has a value CX. In response to receiving the measurement of power delivered, the processor 110 sends a command signal to the driver 1504 to set a capacitance of the shunt capacitor C1 to a value CY. Upon receiving the command signal, the driver 1504 generates a current signal to provide to the motor 1506. When the current signal is received, a rotor of the motor 1506 rotates with respect to a stator of the motor 1506 to change an area between plates of the shunt capacitor C1 to further change a capacitance of the shunt capacitor C1 from CX to the value CY.

After the capacitance is changed to CY, the power sensor 122 provides another measurement of power delivered at the output O2 to the processor 110. The processor 110 determines whether the measurement of power delivered at the output O2 when the capacitance of the shunt capacitor C1 is CY is greater than the measurement of power delivered at the output O2 the capacitance of the shunt capacitor C1 is CX. Upon determining that the measurement of power delivered at the output O2 for the capacitance CY is greater than the measurement of power delivered at the output O2 for the capacitance CX, the processor 110 determines to maintain the capacitance of the shunt capacitor C1 to be CY. On the other hand, upon determining that the measurement of power delivered at the output O2 for the capacitance CX is greater than the measurement of power delivered at the output O2 for the capacitance CY, the processor 110 determines to maintain or sets the capacitance of the shunt capacitor C1 to be CX.

In one embodiment, either the series capacitor C2 or the shunt capacitor C1 is fixed or both the series capacitor C2 and the shunt capacitor C1 are fixed.

In an embodiment, the processor 110 is coupled via another capacitor controller (not shown) to the series capacitor C2 change a capacitance of the series capacitor C2 to reduce power reflected towards the HF RFG from the plasma chamber 106 and to increase power delivered to the plasma chamber 106. For example, the processor 110 controls the series capacitor C2 via the other capacitor controller to increase or decrease a capacitance of the series capacitor C2. The other capacitor controller (not shown) has the same structure and function as that of the capacitor controller 1502.

In one embodiment, the processor 110 controls via the capacitor controller 1502 a capacitance of the shunt capacitor C1 and controls via the other capacitor controller (not shown) the capacitance of the series capacitor C2 to increase power delivered at the output O2 to further increase power delivered to the plasma chamber 106.

In an embodiment, the capacitance of the IMC 104 is determined while the substrate S is being processed within the plasma chamber 106.

Figure 15B:
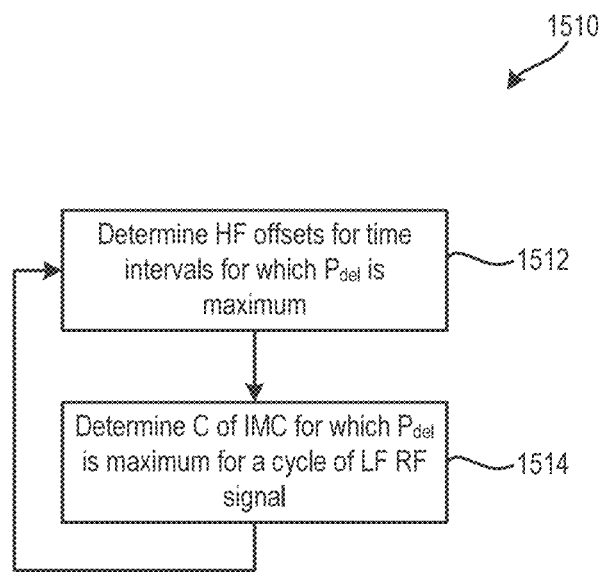
FIG. 15B is a flowchart of an embodiment of a method to illustrate a determination of a capacitance of a shunt capacitor of the impedance matching circuit and determination of frequency offsets of the HF RFG to increase power delivered to the plasma chamber.

FIG. 15B is a flowchart of an embodiment of a method 1510 to illustrate a determination of a capacitance of the shunt capacitor C1 of FIG. 15A and determination of frequency offsets of the HF RFG of FIG. 15A to increase power delivered to the plasma chamber 106 of FIG. 15A. In an operation 1512, the frequency offsets of the RF power supply 120B of the HF RFG are determined to reduce power reflected towards the HF RFG. For example, the HF values within the tables 1 and 2 of FIG. 6 are determined by the processor 110 in the operation 1512. Moreover, in an operation 1514, the capacitance value, such as CX or CY, is determined by the processor 110 for which power delivered to the plasma chamber 106 is maximized. The processor 110 keeps repeating the operations 1512 and 1514 to maximize delivery of power to the plasma chamber 106.

Figure 16A:
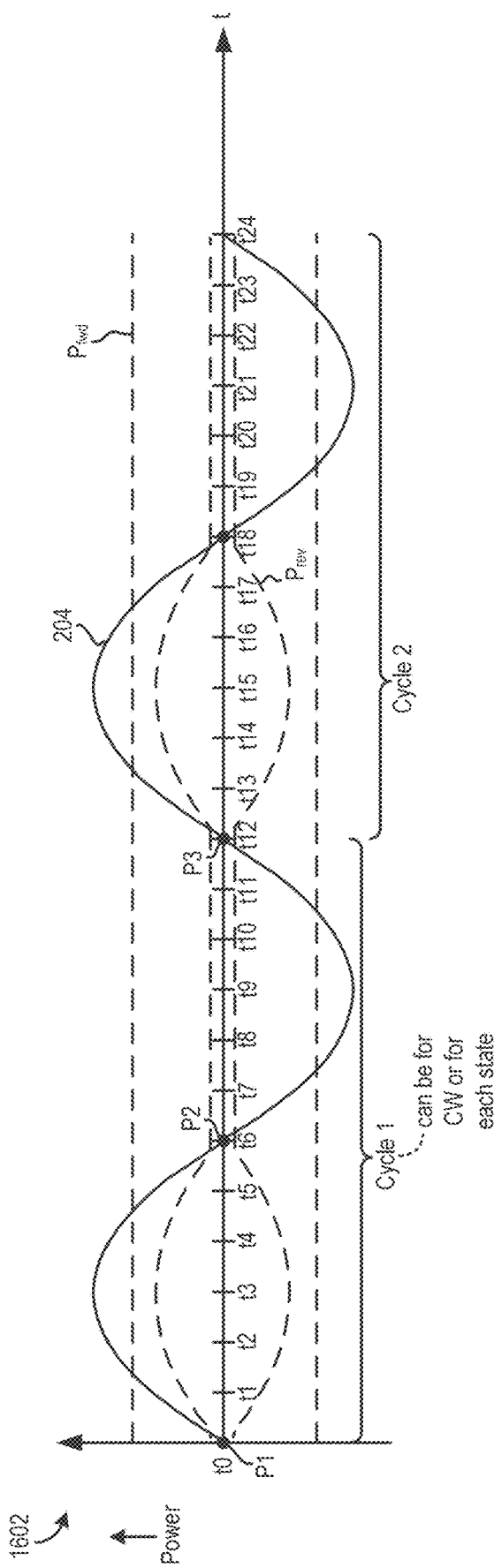
FIG. 16A is an embodiment of a graph to illustrate a determination of frequency offsets of the HF RFG to facilitate a particular process.

FIG. 16A is an embodiment of a graph 1602 to illustrate that the processor 110 of FIG. 1 determines frequency offsets of the HF RFG of FIG. 1 to facilitate a particular process, such as deposition or etching or cleaning or sputtering of the substrate S. The graph 1602 plots power or voltage versus the time t. The graph 1602 includes the voltage signal 204, a plot labeled as $P_{fwd}$ representing power that is supplied at the output O2 by the HF RFG, and a plot $P_{rev}$ representing power that is reflected at the output O2 from the plasma chamber 106 of FIG. 1. The voltage plotted in the graph 1602 is of an RF signal that is generated by the LF RFG and the RF signal is a continuous wave RF signal. Moreover, the plots $P_{fwd}$ and $P_{rev}$ are of an RF signal that is generated by the HF RFG and the RF signal is a continuous wave RF signal.

Instead of applying the empirical method for determining the frequency offsets during a first half of the cycle 1 of the voltage signal 204 for which power reflected at the output O2 is minimum, the processor 110 applies an empirical method to determine frequency offsets for which power reflected at the output O2 is maximum. For example, the processor 110 determines for the time interval between the times t0 and t1, that the HF RFG is to be controlled to operate at a frequency offset HFa for which power reflected at the output O2 is maximum. This is in comparison to another frequency offset HFx of the HF RFG for which power reflected at the output O2 is minimum. Similarly, the processor determines for the time intervals between the times t1 and t6 that the HF RFG is to be controlled to operate at frequency offsets for which power reflected at the output O2 is maximum. During a second half of the cycle 1 of the voltage signal 204, the processor 110 determines frequency offsets for which power reflected at the output O2 is minimum and controls the HF RFG to operate at the frequency offsets during the second half of the cycle 1.

The first half of the cycle 1 starts as the positive zero crossing of the initial point P1 of the voltage signal 204 of FIG. 2A and ends at the negative zero crossing of the midpoint P2 of the voltage signal 204. For example, the first half of the cycle 1 starts at the time t0 and ends at the time t6. The second half of the cycle 1 starts as the negative zero crossing of the midpoint P2 of the voltage signal 204 and ends at the positive zero crossing of the end point P3 of the voltage signal 204. As an example, the second half of the cycle 1 starts at the time t6 and ends at the time t12.

In one embodiment, frequency offsets of the HF RFG are determined by the processor 110 for each state of the multistate RF signal that is generated by the HF RFG so that, for each state, a maximum amount of power is reflected during the first half of each cycle of the LF RFG and a minimum amount of power is reflected during the second half of each cycle of the LF RFG. For example, a first set of frequency offsets of the HF RFG is determined for the first state of the multistate RF signal to maximize an amount of power reflected during the first half of each cycle of the LF RFG and to minimize an amount of power reflected during the second half of each cycle of the LF RFG. Also, a second set of frequency offsets of the HF RFG is determined for the second state of the multistate RF signal to maximize an amount of power reflected during the first half of each cycle of the LF RFG and to minimize an amount of power reflected during the second half of each cycle of the LF RFG.

Figure 16B:
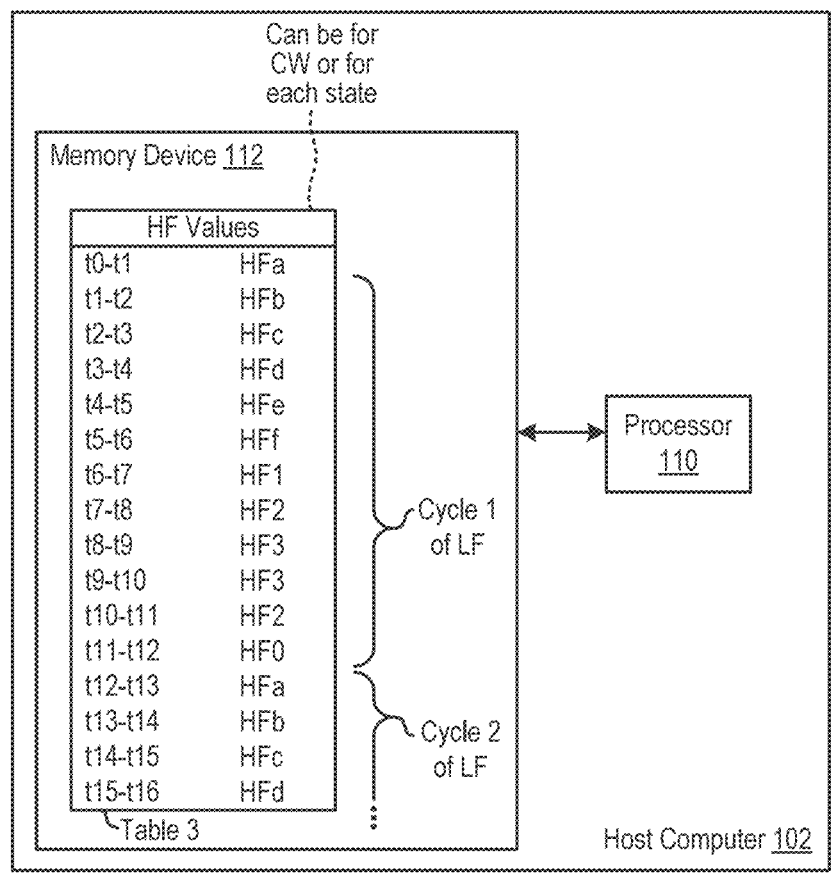
FIG. 16B is a diagram of an embodiment of a host computer to illustrate creation of a table by the host computer for storing the frequency offsets, of FIG. 16A, for which power delivered to the plasma chamber is minimized for a first half of a cycle of operation of the LF RFG and is maximized for a second half of the cycle of operation.

FIG. 16B is a diagram of an embodiment of the host computer 102 to illustrate creation of a table 3 by the processor 110 for storing the frequency offsets for which power delivered to the plasma chamber 106 of FIG. 1 is minimized for the first half of the cycle of operation of the LF RFG and is maximized for the second half of the cycle of operation. The processor 110 controls the HF RFG to operate at the frequency offset HFa during the time period between the times t0 and t1 of the first half of the cycle 1 of operation of the LF RFG and controls the HF RFG to operate at a frequency offset HFb during the time period between the times t1 and t2 of the first half of the cycle 1 of operation to apply the frequency offsets HFa and HFb. Similarly, the processor 110 controls the HF RFG to operate at frequency offsets HFc, HFd, HFe, and HFf during the first half of the cycle 1 of operation of the LF RFG to apply the frequency offsets HFc, HFd, HFe, and HFf. During the second half of the cycle 1 of operation of the LF RFG, the processor 110 controls the HF RFG to operate at the frequency offsets HF1, HF2, HF3, HF3, HF2, and HF0 to apply the frequency offsets HF1, HF2, HF3, HF3, HF2, and HF0. Again during the first half of the cycle 2 of operation of the LF RFG, the processor 110 controls the HF RFG to operate at the frequency offsets HFa, HFb, HFc, HFd, HFe, and HFf to apply the frequency offsets HFa, HFb, HFc, HFd, HFe, and HFf. The frequency offsets stored in the table 3 form a frequency adjusting waveform. The power delivered to the plasma chamber 106 is minimized when power reflected at the output O2 towards the HF RFG is maximized and the power delivered to the plasma chamber 106 is maximized when power reflected at the output O2 towards the HF RFG is minimized.

In one embodiment, the processor 110 controls the HF RFG to operate at frequency offsets for each state of the multistate RF signal that is generated by the HF RFG so that, for each state, a maximum amount of power is reflected during the first half of each cycle of the LF RFG and a minimum amount of power is reflected during the second half of each cycle of the LF RFG. For example, the processor 110 controls the RF power supply 120B of FIG. 1 to operate at the first set of frequency offsets of the HF RFG during the first state of the multistate RF signal to maximize an amount of power reflected during the first half of each cycle of the LF RFG and to minimize an amount of power reflected during the second half of each cycle of the LF RFG. Also, the processor 110 controls the RF power supply 120B of FIG. 1 to operate at the second set of frequency offsets of the HF RFG during the second state of the multistate RF signal to maximize an amount of power reflected during the first half of each cycle of the LF RFG and to minimize an amount of power reflected during the second half of each cycle of the LF RFG.

Figure 17A:
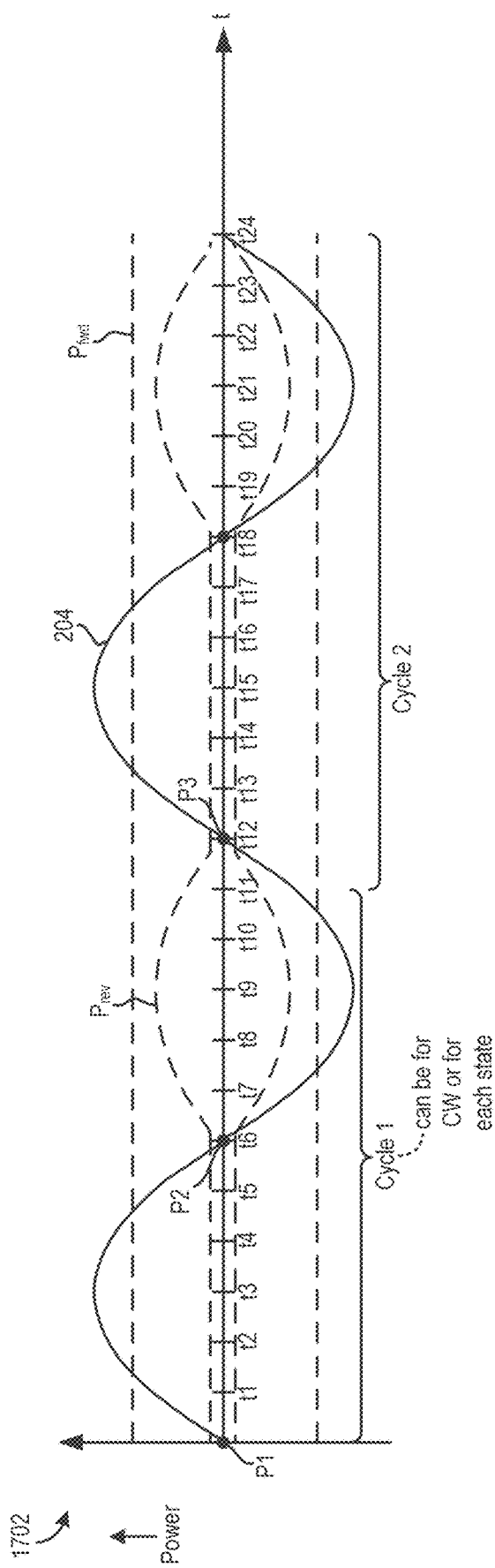
FIG. 17A is an embodiment of a graph to illustrate a determination of frequency offsets of the HF RFG to facilitate another particular process.

FIG. 17A is an embodiment of a graph 1702 to illustrate that the processor 110 of FIG. 1 applies an empirical method to determine frequency offsets of the HF RFG of FIG. 1 to facilitate another particular process. The other particular process is different from the process facilitated by the table 3 of FIG. 17B. For example, if the process facilitated by the table 3 is a deposition operation, the process facilitated by the graph 1702 is an etch operation. As another example, if the process facilitated by the table 3 is a deposition operation having a first deposition rate, the process facilitated by the graph 1702 is a deposition operation having a second deposition rate. The second deposition rate is different from the first deposition rate.

The graph 1702 is similar to the graph 1602 of FIG. 16A in that the graph 1702 plots power or voltage versus the time t. The graph 1702 includes the voltage signal 204, a plot labeled as $P_{fwd}$ representing power that is supplied at the output O2 by the HF RFG, and a plot $P_{rev}$ representing power that is reflected at the output O2 from the plasma chamber 106 of FIG. 1. The voltage plotted in the graph 1702 is of an RF signal that is generated by the LF RFG and the RF signal is a continuous wave RF signal. Moreover, the plots $P_{fwd}$ and $P_{rev}$ plotted in the graph 1702 are of an RF signal that is generated by the HF RFG and the RF signal is a continuous wave RF signal.

During the first half of the cycle 1 of the voltage signal 204, the processor 110 determines frequency offsets for which power reflected at the output O2 is minimum and controls the HF RFG to operate at the frequency offsets during the first half of the cycle 1. Instead of determining the frequency offsets during the second half of the cycle 1 of the voltage signal 204 for which power reflected at the output O2 is minimum, the processor 110 determines frequency offsets for which power reflected at the output O2 is maximum. As an example, the processor 110 determines for the time interval between the times t6 and t7, that the HF RFG is to be controlled to operate at a frequency offset HFa1 for which power reflected at the output O2 from the plasma chamber 106 is maximum compared to another frequency offset HFy for which power reflected at the output O2 is minimum. Similarly, the processor 110 determines for the time intervals between the times t7 and t12 that the HF RFG is to be controlled to operate at frequency offsets for which power reflected at the output O2 is maximum.

In one embodiment, frequency offsets of the HF RFG are determined by the processor 110 for each state of the multistate RF signal that is generated by the HF RFG so that, for each state, a maximum amount of power is reflected during the second half of each cycle of the LF RFG and a minimum amount of power is reflected during the first half of each cycle of the LF RFG. For example, a first set of frequency offsets of the HF RFG are determined for the first state of the multistate RF signal to maximize an amount of power reflected during the second half of each cycle of the LF RFG and to minimize an amount of power reflected during the first half of each cycle of the LF RFG. Also, a second set of frequency offsets of the HF RFG are determined for the second state of the multistate RF signal to maximize an amount of power reflected during the second half of each cycle of the LF RFG and to minimize an amount of power reflected during the first half of each cycle of the LF RFG.

Figure 17B:
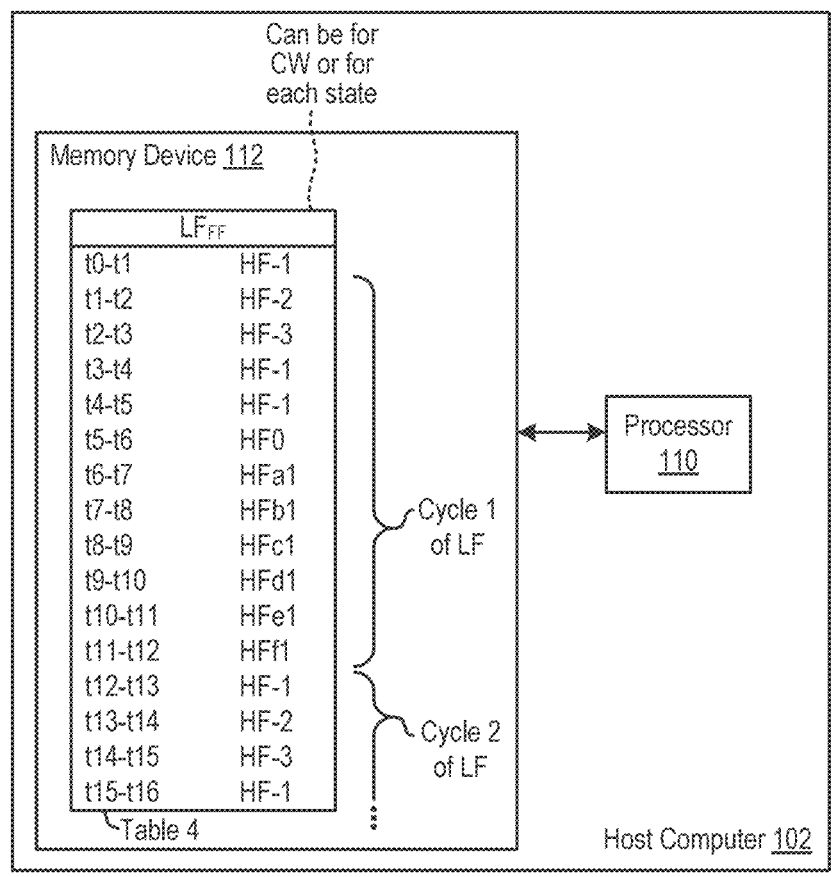
FIG. 17B is a diagram of an embodiment of the host computer to illustrate creation of another table by the processor for storing the frequency offsets, of FIG. 17A, for which power delivered to the plasma chamber is maximized for the first half of the cycle of operation of the LF RFG and is minimized for the second half of the cycle of operation.

FIG. 17B is a diagram of an embodiment of the host computer 102 to illustrate creation of a table 4 by the processor 110 for storing the frequency offsets for which power delivered to the plasma chamber 106 of FIG. 1 is maximized for the first half of the cycle of operation of the LF RFG and is minimized for the second half of the cycle of operation. For example, during the first half of the cycle 1 of operation of the LF RFG, the processor 110 controls the HF RFG to operate at the frequency offsets HF-1, HF-2, HF-3, HF-1, HF-1, and HF0 to apply the frequency offsets HF-1, HF-2, HF-3, HF-1, HF-1, and HF0. Moreover, the processor 110 controls the HF RFG to operate at the frequency offset HFa1 during the time period between the times t6 and t7 of the second half of the cycle 1 of operation of the LF RFG and controls the HF RFG to operate at a frequency offset HFb1 during the time period between the times t7 and t8 of the second half of the cycle 1 of operation to apply the frequency offsets HFa1 and HFb1. Similarly, the processor 110 controls the HF RFG to operate at frequency offsets HFc1, HFd1, HFe1, and HFf1 during the second half of the cycle 1 of operation of the LF RFG to apply the frequency offsets HFc1, HFd1, HFe1, and HFf1. Again during the first half of the cycle 2 of operation of the LF RFG, the processor 110 controls the HF RFG to operate at the frequency offsets HF-1, HF-2, HF-3, HF-1, HF-1, and HF0 to apply the frequency offsets HF-1, HF-2, HF-3, HF-1, HF-1, and HF0. The frequency offsets stored in the table 4 form a frequency adjusting waveform.

In one embodiment, the processor 110 controls the HF RFG to operate at frequency offsets for each state of the multistate RF signal that is generated by the HF RFG so that, for each state, a minimum amount of power is reflected during the first half of each cycle of the LF RFG and a maximum amount of power is reflected during the second half of each cycle of the LF RFG. For example, the processor 110 controls the RF power supply 120B of FIG. 1 to operate at the first set of frequency offsets of the HF RFG during the first state of the multistate RF signal to maximize an amount of power reflected during the first half of each cycle of the LF RFG and to minimize an amount of power reflected during the second half of each cycle of the LF RFG. Also, the processor 110 controls the RF power supply 120B of FIG. 1 to operate at the second set of frequency offsets of the HF RFG during the second state of the multistate RF signal to minimize an amount of power reflected during the first half of each cycle of the LF RFG and to maximize an amount of power reflected during the second half of each cycle of the LF RFG.

It should be noted that each frequency offset illustrated in the table 3 of FIG. 16B is a change in a frequency value with respect to the reference frequency HF0 and each frequency offset illustrated in the table 4 of FIG. 17B is a change in a frequency value with respect to the reference frequency HF0.1.

Figure 18:
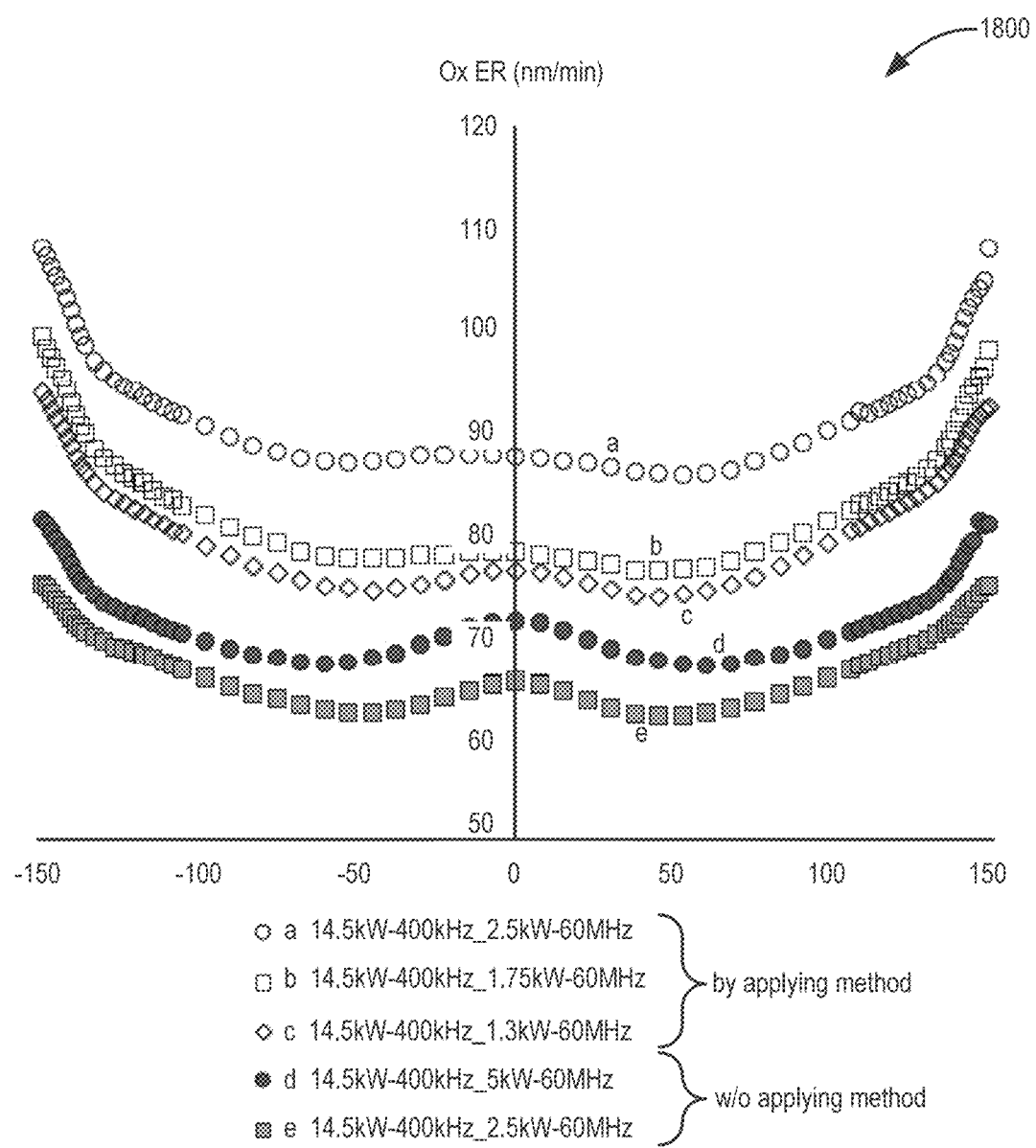
FIG. 18 is an embodiment of a graph to illustrate an increase in uniformity in an etch rate when the method for optimizing power to be delivered to the plasma chamber is applied compared to when the method is not applied.

FIG. 18 is an embodiment of a graph 1800 to illustrate an increase in an amount of delivered power and an increase in a radial uniformity in an etch rate when the method for optimizing power to be delivered to the plasma chamber 106 is applied compared to when the method is not applied. The graph 1800 plots the etch rate versus a radius of the substrate S of FIG. 6. The graph 1800 includes plots a, b, and c, which are generated when the method is applied, and further includes plots d and e that are generated when the method is not applied. As illustrated in the graph 1800, a higher oxide etch rate is achieved when the method for optimizing power to be delivered to the plasma chamber 106 compared to when the method is not applied for similar amounts of forward power supplied by the HF RFG. The application of the method for optimizing power to be delivered to the plasma chamber 106 results in a higher amount of delivered power, which results in the higher etch rate. For example, the plots a and e are generated when an amount of forward power supplied by the HF RFG is similar or the same. A comparison between the plots a and e illustrate that when the method for optimizing power to be delivered to the plasma chamber 106 is applied, there is more efficient delivery of power to the plasma chamber 106 compared to when the method is not applied. The more efficient delivery of power increases the oxide etch rate by approximately 30% Also, the plots a, b, and c illustrate that there is a higher uniformity in an etch rate across a surface of the substrate S compared to the etch rate illustrated by the plots d and e.

Figure 19:
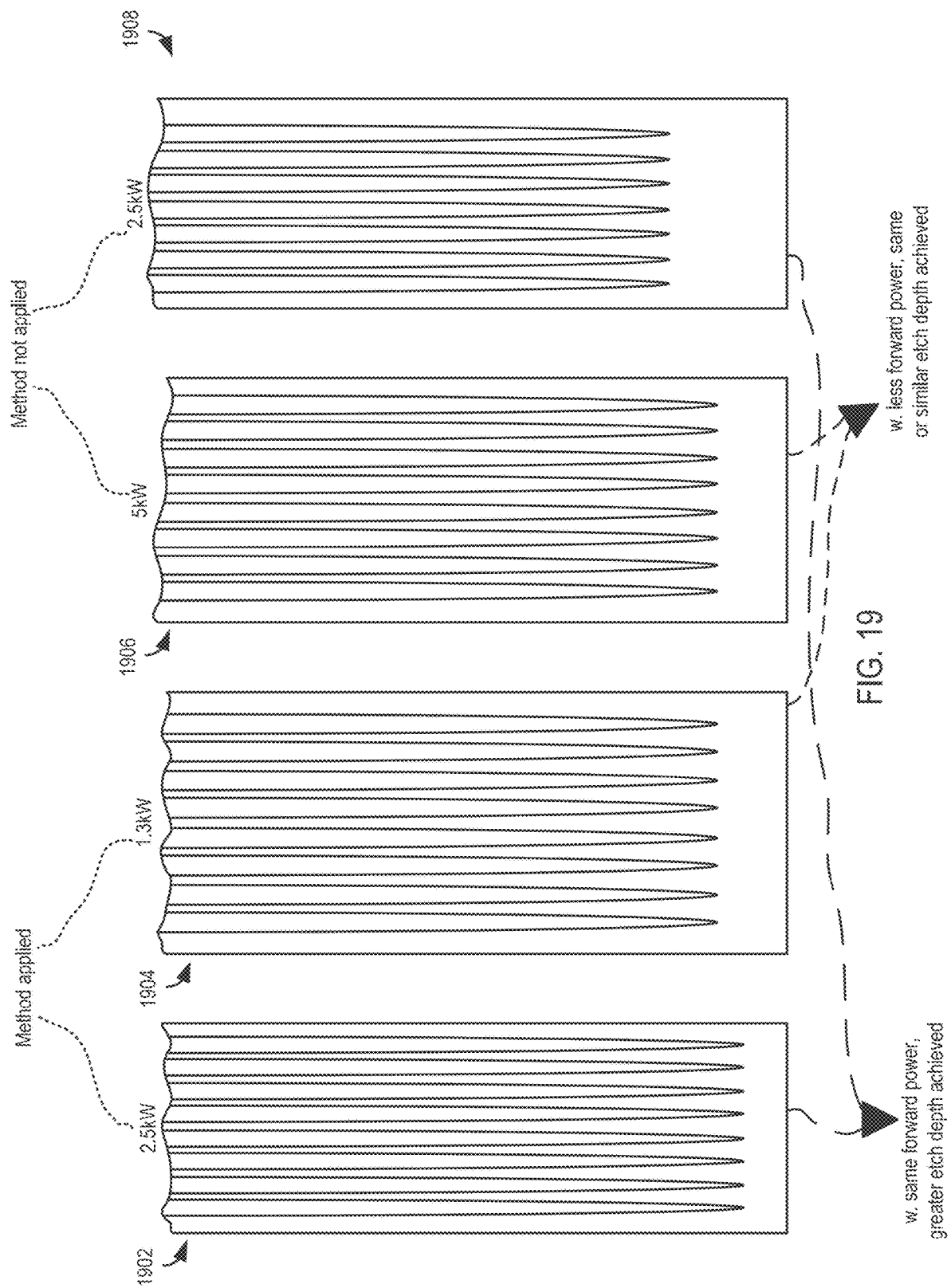
FIG. 19 is a diagram to illustrate that a greater etch depth is achieved when the method for optimizing power to be delivered to the plasma chamber is applied than an etch depth achieved when the method is not applied.

FIG. 19 is a diagram to illustrate that a greater etch depth is achieved when the method for optimizing power to be delivered to the plasma chamber 106 of FIG. 6 is applied than an etch depth achieved when the method is not applied. FIG. 19 includes a plot 1902 that is generated when the HF RFG supplies 2.5 kilowatts (kW) of power at the output O2 of FIG. 1, a plot 1904 generated when the HF RFG supplies 1.3 kW of power at the output O2, a plot 1906 generated when the HF RFG supplies 5 kW of power at the output O2, and a plot 1908 generated when the HF RFG supplies 2.5 kW of power at the output O2. The plots 1906 and 1908 are generated when the method for optimizing power to be delivered to the plasma chamber 106 is not applied and the plots 1902 and 1904 are generated when the method is applied. Each plot 1902, 1904, 1906, and 1908 plots etch depth across a surface of the substrate S of FIG. 6.

As illustrated from the plots 1902 and 1908, when the same amount of power is supplied by the HF RFG, a greater amount of etch depth is achieved when the method is applied compared to when the method is not applied. Moreover as illustrated from the plots 1904 and 1906, a similar amount of etch depth is achieved when a lower amount of power, e.g. 1.3 kW, is supplied with frequency offsets of the HF RFG compared to an amount of power, e.g., 5 kW, supplied with a frequency offset of the HF RFG. The frequency offsets applied with the lower amount of power are generated by applying the method for optimizing power to be delivered to the plasma chamber 106.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

What is claimed is:

1. A method for reducing reflected power, comprising:
   determining a capacitance of an impedance matching circuit for which power reflected towards a high frequency (HF) radio frequency (RF) generator is reduced;
   determining a plurality of offsets from a reference frequency of the HF RF generator, wherein each of the plurality of offsets is determined for a corresponding one of a plurality of time intervals of a cycle of a waveform associated with a low frequency (LF) RF generator;
   controlling the impedance matching circuit to have the capacitance; and
   controlling the HF RF generator to operate at the plurality of offsets with respect to the reference frequency.

2. The method of claim 1, further comprising:
   determining a first capacitance value for which a first amount of the power is reflected towards the HF RF generator;
   determining a second capacitance value for which a second amount of the power is reflected towards the HF RF generator;
   comparing the first amount to the second amount to determine that the first amount is less than the second amount,
   wherein said determining the capacitance of the impedance matching circuit for which power reflected towards the HF RF generator is reduced includes selecting the first capacitance value instead of the second capacitance value.

3. The method of claim 1, wherein the plurality of offsets includes a plurality of frequency values of the HF RF generator, wherein said each of the plurality of offsets reduces the power reflected towards the HF RF generator.

4. The method of claim 3, further comprising:
   determining a first one of the plurality of offsets for which a first amount of power is reflected towards the HF RF generator;
   determining a second offset value for which a second amount of power is reflected towards the HF RF generator, wherein the first one of the plurality of offsets and the second offset value are associated with one of the plurality of time intervals of the cycle;
   comparing the first amount of power to the second amount of power to determine that the first amount is less than the second amount,
   wherein said determining the plurality of offsets includes selecting the first one of the plurality of offsets instead of the second offset value.

5. The method of claim 1, wherein the reference frequency is a frequency of operation of the HF RF generator during a time interval in which a zero crossing of the waveform occurs.

6. The method of claim 1, wherein each of the plurality of frequency offsets is generated by subtracting a respective frequency value from or adding the respective frequency value to the reference frequency.

7. The method of claim 6, wherein the respective frequency value is different for one or more of the plurality of time intervals.

8. The method of claim 1, wherein the waveform is a voltage signal, the method further comprising dividing the voltage signal into the plurality of time intervals, wherein one of the plurality of time intervals is equal to another one of the plurality of time intervals.

9. A controller for reducing reflected power, comprising:
   a processor configured to:
      determine a capacitance of an impedance matching circuit for which power reflected towards a high frequency (HF) radio frequency (RF) generator is reduced;
      determine a plurality of offsets from a reference frequency of the HF RF generator, wherein each of the plurality of offsets is determined for a corresponding one of a plurality of time intervals of a cycle of a waveform associated with a low frequency (LF) RF generator;
      control the impedance matching circuit to have the capacitance; and
      control the HF RF generator to operate at the plurality of offsets with respect to the reference frequency; and
   a memory device coupled to the processor.

10. The controller of claim 9, wherein the processor is configured to:
    determine a first capacitance value for which a first amount of the power is reflected towards the HF RF generator;
    determine a second capacitance value for which a second amount of the power is reflected towards the HF RF generator;
    compare the first amount to the second amount to determine that the first amount is less than the second amount,
    wherein to determine the capacitance of the impedance matching circuit for which power reflected towards the HF RF generator is reduced, the processor is configured to select the first capacitance value instead of the second capacitance value.

11. The controller of claim 9, wherein the plurality of offsets includes a plurality of frequency values of the HF RF generator, wherein said each of the plurality of offsets reduces the power reflected towards the HF RF generator.

12. The controller of claim 11, wherein the processor is configured to:
    determine a first one of the plurality of offsets for which a first amount of power is reflected towards the HF RF generator;
    determine a second offset value for which a second amount of power is reflected towards the HF RF generator, wherein the first one of the plurality of offsets and the second offset value are associated with one of the plurality of time intervals of the cycle;
    compare the first amount of power to the second amount of power to determine that the first amount is less than the second amount,
    wherein to determine the plurality of offsets, the processor is configured to select the first one of the plurality of offsets instead of the second offset value.

13. The controller of claim 9, wherein the reference frequency is a frequency of operation of the HF RF generator during a time interval in which a zero crossing of the waveform occurs.

14. The controller of claim 9, wherein each of the plurality of frequency offsets is generated by subtracting a respective frequency value from or adding the respective frequency value to the reference frequency.

15. The controller of claim 14, wherein the respective frequency value is different for one or more of the plurality of time intervals.

16. The controller of claim 9, wherein the waveform is a voltage signal, the method further comprising dividing the voltage signal into the plurality of time intervals, wherein one of the plurality of time intervals is equal to another one of the plurality of time intervals.

17. A plasma system comprising:
  a low frequency (LF) radio frequency (RF) generator configured to generate an LF RF signal;
  a high frequency (HF) RF generator configured to generate an HF RF signal;
  an impedance matching circuit coupled to the LF RF generator and the HF RF generator, wherein the impedance matching circuit is configured to receive the LF RF signal and the HF RF signal to output a modified signal;
  a plasma chamber coupled to the impedance matching circuit to receive the modified signal; and
  a controller coupled to the HF RF generator and the impedance matching circuit, wherein the controller is configured to:
    determine a capacitance of the impedance matching circuit for which power reflected towards the HF RF generator is reduced;
    determine a plurality of offsets from a reference frequency of the HF RF generator, wherein each of the plurality of offsets is determined for a corresponding one of a plurality of time intervals of a cycle of a waveform associated with the LF RF generator;
    control the impedance matching circuit to have the capacitance; and
    control the HF RF generator to operate at the plurality of offsets with respect to the reference frequency.

18. The plasma system of claim 17, wherein the controller is configured to:
  determine a first capacitance value for which a first amount of the power is reflected towards the HF RF generator;
  determine a second capacitance value for which a second amount of the power is reflected towards the HF RF generator;
  compare the first amount to the second amount to determine that the first amount is less than the second amount,
  wherein to determine the capacitance of the impedance matching circuit for which power reflected towards the HF RF generator is reduced, the controller is configured to select the first capacitance value instead of the second capacitance value.

19. The plasma system of claim 17, wherein the plurality of offsets includes a plurality of frequency values of the HF RF generator, wherein said each of the plurality of offsets reduces the power reflected towards the HF RF generator.

20. The plasma system of claim 19, wherein the controller is configured to:
  determine a first one of the plurality of offsets for which a first amount of power is reflected towards the HF RF generator;
  determine a second offset value for which a second amount of power is reflected towards the HF RF generator, wherein the first one of the plurality of offsets and the second offset value are associated with one of the plurality of time intervals of the cycle;
  compare the first amount of power to the second amount of power to determine that the first amount is less than the second amount,
  wherein to determine the plurality of offsets, the processor is configured to select the first one of the plurality of offsets instead of the second offset value.

\* \* \* \* \*